(12) United States Patent
Kimoto

(10) Patent No.: US 12,342,673 B2
(45) Date of Patent: Jun. 24, 2025

(54) LIGHT EMITTING ELEMENT, LIGHT EMITTING DEVICE, AND DISPLAY DEVICE

(71) Applicant: SHARP KABUSHIKI KAISHA, Sakai (JP)

(72) Inventor: Kenji Kimoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 124 days.

(21) Appl. No.: 17/767,807

(22) PCT Filed: Oct. 29, 2019

(86) PCT No.: PCT/JP2019/042284
§ 371 (c)(1),
(2) Date: Apr. 8, 2022

(87) PCT Pub. No.: WO2021/084599
PCT Pub. Date: May 6, 2021

(65) Prior Publication Data
US 2024/0074225 A1 Feb. 29, 2024

(51) Int. Cl.
*H10K 50/15* (2023.01)
*H10K 50/16* (2023.01)
(Continued)

(52) U.S. Cl.
CPC .......... *H10K 50/156* (2023.02); *H10K 50/15* (2023.02); *H10K 50/16* (2023.02); *H10K 50/818* (2023.02); *H10K 50/828* (2023.02); *H10K 50/17* (2023.02); *H10K 2101/50* (2023.02); *H10K 2102/351* (2023.02)

(58) Field of Classification Search
CPC ...... H10K 50/15; H10K 50/16; H10K 50/818; H10K 50/828; H10K 2101/50; H10K 2102/351
See application file for complete search history.

(56) References Cited

U.S. PATENT DOCUMENTS

2010/0108984 A1 5/2010 Cho et al.
2011/0121312 A1* 5/2011 Moteki .................. H01L 33/14
257/E33.025
(Continued)

FOREIGN PATENT DOCUMENTS

JP 2010114079 A 5/2010

*Primary Examiner* — Jay C Kim
*Assistant Examiner* — Woo K Lee
(74) *Attorney, Agent, or Firm* — ScienBiziP, P.C.

(57) ABSTRACT

A light-emitting element includes a first electrode, a second electrode, a light-emitting layer, a hole injection layer provided between the first electrode and the light-emitting layer, and a hole transport layer provided between the hole injection layer and the light-emitting layer, wherein an insulator layer is provided between the hole injection layer and the hole transport layer. The hole injection layer, the insulator layer, and the hole transport layer each include a compound including one or more types of a cation and one or more types of an anion, the anion includes a group 15 or group 16 element of the periodic table, and an average oxidation number of cations in the insulator layer is greater than an average oxidation number of cations in the hole transport layer and less than an average oxidation number of cations in the hole injection layer.

20 Claims, 17 Drawing Sheets

(51) Int. Cl.
*H10K 50/17* (2023.01)
*H10K 50/818* (2023.01)
*H10K 50/828* (2023.01)
*H10K 101/50* (2023.01)
*H10K 102/00* (2023.01)

(56) References Cited

U.S. PATENT DOCUMENTS

| | | | |
|---|---|---|---|
| 2014/0070189 A1* | 3/2014 | Leem | H10K 59/80524 |
| | | | 257/40 |
| 2016/0293902 A1* | 10/2016 | Kato | H10K 50/166 |
| 2017/0005285 A1* | 1/2017 | Bao | H10K 50/15 |

* cited by examiner

| Layer used | Material name | Average oxidation value of cations |
|---|---|---|
| 33 (Hole injection layer (HIL)) | $MoO_3$, $WO_3$ | +6 |
| | $SnO_2$ | +4 |
| | $In_2O_3$ | +3 |
| 37 (Insulator layer) | $Ta_2O_5$ | +5 |
| | $HfO_2$, $ZrO_2$, $SiO_2$, $GeO_2$ | +4 |
| | $Al_2O_3$, $Ga_2O_3$, $Y_2O_3$, $La_2O_3$ | +3 |
| | $SrO$, $MgO$ | +2 |
| 34 (Hole transport layer (HTL)) | PEDOT:PSS, PVK, TFB, NPD | 0 |
| | $Cu_2O$ | +1 |
| | $NiO$, $CuO$, $CuAlO_2$ | +2 |

FIG. 5

| Combination examples | 33 (Hole injection layer (HIL)) | 37 (Insulator layer) | 34 (Hole transport layer (HTL)) |
|---|---|---|---|
| 1 | $MoO_3$, $WO_3$ | $Ta_2O_5$, $HfO_2$, $ZrO_2$, $SiO_2$, $GeO_2$, $Al_2O_3$, $Ga_2O_3$, $Y_2O_3$, $La_2O_3$, $SrO$, $MgO$ | PEDOT:PSS, PVK, TFB, NPD |
| 2 | $MoO_3$, $WO_3$ | $Ta_2O_5$, $HfO_2$, $ZrO_2$, $SiO_2$, $GeO_2$, $Al_2O_3$, $Ga_2O_3$, $Y_2O_3$, $La_2O_3$, $SrO$, $MgO$ | $Cu_2O$ |
| 3 | $MoO_3$, $WO_3$ | $Ta_2O_5$, $HfO_2$, $ZrO_2$, $SiO_2$, $GeO_2$, $Al_2O_3$, $Ga_2O_3$, $Y_2O_3$, $La_2O_3$ | NiO, CuO |
| 4 | $MoO_3$, $WO_3$ | $Ta_2O_5$, $HfO_2$, $ZrO_2$, $SiO_2$, $GeO_2$ | $CuAlO_2$ |
| 5 | $SnO_2$ | $Al_2O_3$, $Ga_2O_3$, $Y_2O_3$, $La_2O_3$, $SrO$, $MgO$ | PEDOT:PSS, PVK, TFB, NPD |
| 6 | $SnO_2$ | $Al_2O_3$, $Ga_2O_3$, $Y_2O_3$, $La_2O_3$, $SrO$, $MgO$ | $Cu_2O$ |
| 7 | $SnO_2$ | $Al_2O_3$, $Ga_2O_3$, $Y_2O_3$, $La_2O_3$ | NiO, CuO |
| 8 | $In_2O_3$, ITO | $SrO$, $MgO$ | PEDOT:PSS, PVK, TFB, NPD |
| 9 | $In_2O_3$, ITO | $SrO$, $MgO$ | $Cu_2O$ |

FIG. 6

| Material name | Electron affinity (eV) |
|---|---|
| $MoO_3$ | 6.0 |
| $WO_3$ | 6.0 |
| $SnO_2$ | 4.5 |
| $In_2O_3$ | 5.3 |

FIG. 7

| Material name | Ionization potential (eV) |
|---|---|
| PEDOT:PSS | 5.2 |
| PVK | 5.8 |
| TFB | 5.3 |
| NPD | 5.5 |
| $Cu_2O$ | 5.3 |
| NiO | 5.2 |
| CuO | 5.4 |
| $CuAlO_2$ | 5.3 |

FIG. 8

| Combination examples | 33 (Hole injection layer (HIL)) | 38 (First insulator layer) | 39 (Second insulator layer) | 34 (Hole transport layer (HTL)) |
|---|---|---|---|---|
| 10 | $MoO_3$, $WO_3$ | $Ta_2O_5$ | $HfO_2$, $ZrO_2$, $SiO_2$, $GeO_2$, $Al_2O_3$, $Ga_2O_3$, $Y_2O_3$, $La_2O_3$, $SrO$, $MgO$ | PEDOT:PSS, PVK, TFB, NPD, $Cu_2O$ |
| 11 | $MoO_3$, $WO_3$ | $HfO_2$, $ZrO_2$, $SiO_2$, $GeO_2$ | $Al_2O_3$, $Ga_2O_3$, $Y_2O_3$, $La_2O_3$, $SrO$, $MgO$ | PEDOT:PSS, PVK, TFB, NPD, $Cu_2O$ |
| 12 | $MoO_3$, $WO_3$ | $Al_2O_3$, $Ga_2O_3$, $Y_2O_3$, $La_2O_3$ | $SrO$, $MgO$ | PEDOT:PSS, PVK, TFB, NPD, $Cu_2O$ |
| 13 | $MoO_3$, $WO_3$ | $Ta_2O_5$ | $HfO_2$, $ZrO_2$, $SiO_2$, $GeO_2$, $Al_2O_3$, $Ga_2O_3$, $Y_2O_3$, $La_2O_3$ | NiO, CuO |
| 14 | $MoO_3$, $WO_3$ | $HfO_2$, $ZrO_2$, $SiO_2$, $GeO_2$ | $Al_2O_3$, $Ga_2O_3$, $Y_2O_3$, $La_2O_3$ | NiO, CuO, $CuAlO_2$ |
| 15 | $SnO_2$ | $Al_2O_3$, $Ga_2O_3$, $Y_2O_3$, $La_2O_3$ | $SrO$, $MgO$ | PEDOT:PSS, PVK, TFB, NPD, $Cu_2O$ |

FIG. 10

| Combination examples | 33 (Hole injection layer (HIL)) | 40 (First insulator layer) | 42 (Second insulator layer) | 43 (Third insulator layer) | 34 (Hole transport layer (HTL)) |
|---|---|---|---|---|---|
| 16 | $MoO_3$, $WO_3$ | $Ta_2O_5$ | $HfO_2$, $ZrO_2$, $SiO_2$, $GeO_2$ | $Al_2O_3$, $Ga_2O_3$, $Y_2O_3$, $La_2O_3$, $SrO$, $MgO$ | PEDOT:PSS, PVK, TFB, NPD, $Cu_2O$ |
| 17 | $MoO_3$, $WO_3$ | $HfO_2$, $ZrO_2$, $SiO_2$, $GeO_2$ | $Al_2O_3$, $Ga_2O_3$, $Y_2O_3$, $La_2O_3$ | $SrO$, $MgO$ | PEDOT:PSS, PVK, TFB, NPD, $Cu_2O$ |
| 18 | $MoO_3$, $WO_3$ | $Ta_2O_5$ | $HfO_2$, $ZrO_2$, $SiO_2$, $GeO_2$ | $Al_2O_3$, $Ga_2O_3$, $Y_2O_3$, $La_2O_3$ | NiO, CuO |

FIG. 12

| Combination examples | 33 (Hole injection layer (HIL)) | 43 (First insulator layer) | 44 (Second insulator layer) | 45 (Third insulator layer) | 46 (Fourth insulator layer) | 34 (Hole transport layer (HTL)) |
|---|---|---|---|---|---|---|
| 19 | $MoO_3$, $WO_3$ | $Ta_2O_5$ | $HfO_2$, $ZrO_2$, $SiO_2$, $GeO_2$ | $Al_2O_3$, $Ga_2O_3$, $Y_2O_3$, $La_2O_3$ | $SrO$, $MgO$ | PEDOT:PSS, PVK, TFB, NPD, $Cu_2O$ |

FIG. 14

LIGHT EMITTING ELEMENT, LIGHT EMITTING DEVICE, AND DISPLAY DEVICE

TECHNICAL FIELD

The disclosure relates to a light-emitting element, a light-emitting device including the light-emitting element, and a display device including the light-emitting element.

BACKGROUND ART

In recent years, various display devices have been developed. Particularly, a display device including an Organic Light Emitting Diode (OLED) and a display device including an inorganic light-emitting diode or a Quantum dot Light Emitting Diode (QLED) have drawn a great deal of attention because the devices are capable of achieving lower power consumption, smaller thickness, higher picture quality, and the like.

However, in a light-emitting element, such as an OLED, QLED, and the like, for reasons described below, there is a problem in that the luminous efficiency is likely to decrease because the hole injection to the light-emitting layer does not easily efficiently occur.

FIG. 17 is an energy band diagram for describing the reason as to why, in a known light-emitting element 201R, hole injection to the light-emitting layer does not easily occur.

As illustrated in FIG. 17, the light-emitting element 201R includes a first electrode 22 (anode electrode) and a second electrode 25 (cathode electrode). A hole injection layer (HIL) 133, a hole transport layer (HTL) 34, a light-emitting layer 35R, and an electron transport layer (ETL) 204 are layered in this order from the first electrode 22 side between the first electrode 22 and the second electrode 25.

In the light-emitting element 201R, if the energy difference between the Fermi level of the first electrode 22 and the valence band upper end of the hole transport layer (HTL) 34 is large, efficient hole injection cannot occur, and thus the hole injection layer (HIL) 133 with an electron affinity Ew is provided between the first electrode 22 and the hole transport layer (HTL) 34.

However, in the related art, because the hole injection layer (HIL) 133 in which the electron affinity Ew is not sufficiently large is used, even when the hole injection layer (HIL) 133 is provided between the first electrode 22 and the hole transport layer (HTL) 34, as illustrated in FIG. 17, still, the energy difference between the lower end of the conduction band of the hole injection layer (HIL) 133 and the valence band upper end of the hole transport layer (HTL) 34 is large, and a hole injection barrier Eh is present between the hole injection layer (HIL) 133 and the hole transport layer (HTL) 34. Thus, in the light-emitting element 201R, hole injection between the hole injection layer (HIL) 133 and the hole transport layer (HTL) 34 is unlikely to occur efficiently, and as a result, problematically, the hole injection to the light-emitting layer is less likely to occur efficiently and the luminous efficiency is likely to be negatively affected. Note that the hole injection barrier Eh is an energy difference between the conduction band lower end of the hole injection layer (HIL) and the valence band upper end of the hole transport layer (HTL), and when the conduction band lower end of the hole injection layer (HIL) is above the valence band upper end of the hole transport layer (HTL), $Eh>0$ is true and when the conduction band lower end of the hole injection layer (HIL) is below the valence band upper end of the hole transport layer (HTL), $Eh<0$ is true. In a case where $Eh<0$ (is negative), it means that there is no hole injection barrier present.

Here, the light-emitting element 201R provided with the light-emitting layer 35R that emits red is given as an example, but no such limitation is intended, and the same problem occurs in a light-emitting element provided with a light-emitting layer that emits green and a light-emitting element provided with light-emitting layer that emits blue.

As described in PTL 1, the band level of a light-emitting layer can be adjusted by forming a light-emitting layer having an organic ligand distribution in which the surface contacting the hole transport layer and the surface contacting the electron transport layer are different from each other. Specifically, it is described that by adjusting the band level of the light-emitting layer so that the energy difference between the valence band level of the hole transport layer and the valence band level of the light-emitting layer can be reduced, a light-emitting element having a low turn-on voltage and a low drive voltage and superior brightness and luminous efficiency can be achieved.

CITATION LIST

Patent Literature

PTL 1: JP 2010-114079 A (published on May 20, 2010)

SUMMARY

Technical Problem

However, as described in PTL 1, the difference in ionization potential between the light-emitting layer with no band level adjustment and the light-emitting layer with an adjusted band level is small and effective band level adjustment cannot be performed. In addition, the band-level adjustment method described in PTL 1 cannot be applied to adjustment of the height of the hole injection barrier Eh, which is the energy difference between the lower end of the conduction band of the hole injection layer (HIL) 133 and the valence band upper end of the hole transport layer (HTL) 34 of the light-emitting element 201R illustrated in FIG. 17. Thus, for example, even when the band-level adjustment method described in PTL 1 is applied to the known light-emitting element 201R, still, because the height of the hole injection barrier Eh of the light-emitting element 201R illustrated in FIG. 17 remains the same, hole injection from the hole injection layer (HIL) to the hole transport layer (HTL) is unlikely to occur efficiently and the luminous efficiency is likely to be negatively affected.

In addition, in the light-emitting element 201R illustrated in FIG. 17, it is conceivable to reduce the hole injection barrier Eh by using another hole injection layer (HIL) with a larger electron affinity than the electron affinity Ew of the hole injection layer (HIL) 133. However, with the configuration of the light-emitting element 201R illustrated in FIG. 17 in which the hole injection layer (HIL) and the hole transport layer (HTL) are in direct contact, a vacuum level shift is likely to occur at the interface between the hole injection layer (HIL) and the hole transport layer (HTL) due to an interface state being easily formed at the interface between the hole injection layer (HIL) and the hole transport layer (HTL). Thus, the lower end of the conduction band of the other hole injection layer (HIL) with a larger electron affinity than the electron affinity Ew of the hole injection layer (HIL) 133 shifts toward the upper side of the diagram.

As a result, even if another hole injection layer (HIL) with a larger electron affinity than the electron affinity Ew of the hole injection layer (HIL) 133 is used instead of the hole injection layer (HIL) 133, the effect of reducing the hole injection barrier at the interface between the other hole injection layer (HIL) with a larger electron affinity than the electron affinity Ew of the hole injection layer (HIL) 133 and the hole transport layer (HTL) 34 is less likely to occur, and thus hole injection from the hole injection layer (HIL) to the hole transport layer (HTL) is unlikely to occur efficiently and the luminous efficiency is likely to be degraded.

An aspect of the disclosure has been made in view of the above-mentioned issue, and an object of the disclosure is to provide a light-emitting element with a high luminous efficiency that is capable of efficient hole injection, a light-emitting device including the light-emitting element, and a display device including the light-emitting element.

Solution to Problem

To solve the problem described above, a light-emitting element according to an aspect of the disclosure is a light-emitting element including:
a first electrode that is an anode;
a second electrode that is a cathode;
a light-emitting layer provided between the first electrode and the second electrode;
a hole injection layer provided between the first electrode and the light-emitting layer; and
a hole transport layer provided between the hole injection layer and the light-emitting layer, wherein
an insulator layer is provided between the hole injection layer and the hole transport layer in contact with the hole injection layer and the hole transport layer;
the hole injection layer, the insulator layer, and the hole transport layer each include a compound including one or more types of a cation and one or more types of an anion;
the anion includes a group 15 or group 16 element of the periodic table; and an average oxidation number of cations in the insulator layer is greater than an average oxidation number of cations in the hole transport layer and less than an average oxidation number of cations in the hole injection layer.

In order to solve the problem described above, a light-emitting device according to an aspect of the disclosure includes the light-emitting element and a control circuit that controls light emission of the light-emitting element.

In order to solve the problem described above, a display device according to an aspect of the disclosure includes the light-emitting element and a control circuit that controls light emission of the light-emitting element.

Advantageous Effects of Disclosure

According to an aspect of the disclosure, a light-emitting element with a high luminous efficiency that is capable of efficient hole injection, a light-emitting device including the light-emitting element, and a display device including the light-emitting element can be provided.

BRIEF DESCRIPTION OF DRAWINGS

FIG. 5 is a diagram listing examples of materials that can be used as the hole injection layer, the insulator layer, and the hole transport layer provided in the light-emitting element according to the first embodiment and the average oxidation number of the cations in the materials.

FIG. 6 is a diagram listing example combinations of materials that can be used as the hole injection layer, the insulator layer, and the hole transport layer provided in the light-emitting element according to the first embodiment.

FIG. 7 is a diagram listing examples of materials that can be used as the hole injection layer provided in the light-emitting element of the first embodiment illustrated in FIG. 5 and the electron affinity of each material.

FIG. 8 is a diagram listing examples of materials that can be used as the hole transport layer provided in the light-emitting element of the first embodiment illustrated in FIG. 5 and the ionization potential of each material.

FIG. 10 is a diagram listing example combinations of materials that can be used as a hole injection layer, a first insulator layer, a second insulator layer, and a hole transport layer provided in the light-emitting element according to the second embodiment.

FIG. 12 is a diagram listing example combinations of materials that can be used as a hole injection layer, a first insulator layer, a second insulator layer, a third insulator layer, and a hole transport layer provided in the light-emitting element according to the third embodiment.

FIG. 14 is a diagram listing example combinations of materials that can be used as a hole injection layer, a first insulator layer, a second insulator layer, a third insulator layer, a fourth insulator layer, and a hole transport layer provided in the light-emitting element according to the fourth embodiment.

DESCRIPTION OF EMBODIMENTS

Embodiments of the disclosure will be described with reference to FIG. 1 to FIG. 16 as follows. Hereinafter, for convenience of explanation, components having the same functions as those described in a specific embodiment are appended with the same reference signs, and descriptions thereof may be omitted.

In the following embodiments of the disclosure, a display device including a light-emitting element and a control circuit that controls the light emission of the light-emitting element is used as an example of a light-emitting device including a light-emitting element and a control circuit that controls the light emission of the light-emitting element. However, no such limitation is intended, and an illumination device including a light-emitting element and a control circuit that controls the light emission of the light-emitting element may be used, for example.

First Embodiment

Figure 2:
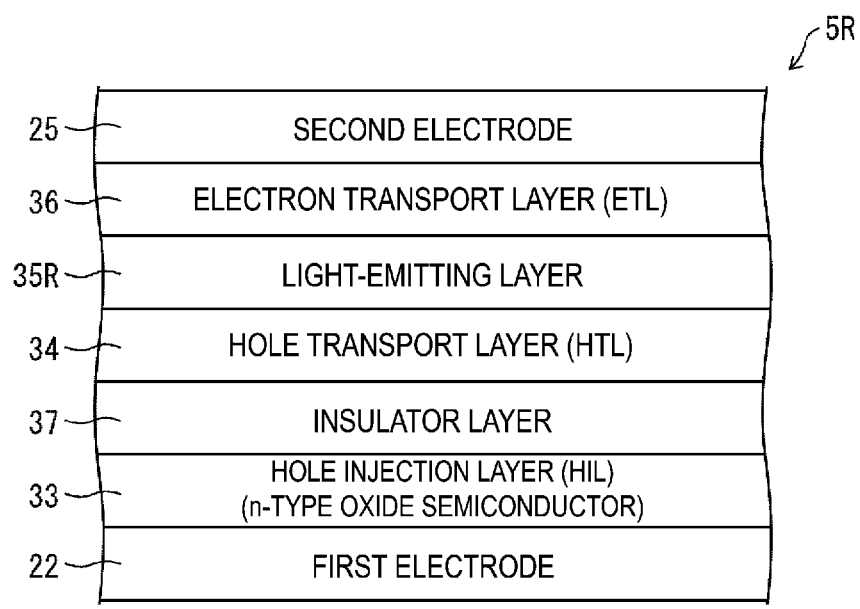
FIG. 2 is a diagram illustrating a schematic configuration of the light-emitting element according to the first embodiment.

FIG. 2 is a diagram illustrating a schematic configuration of a light-emitting element 5R according a first embodiment.

As illustrated in FIG. 2, the light-emitting element 5R includes a first electrode 22, a second electrode (electron injection layer: EIL) 25, and a light-emitting layer 35R provided between the first electrode 22 and the second electrode 25. In other words, the first electrode 22 is an anode, and the second electrode 25 is a cathode. A hole injection layer (HIL) 33, an insulator layer 37, and a hole transport layer (HTL) 34 are layered in this order between the first electrode 22 and the light-emitting layer 35R from the first electrode 22 side. Also, an electron transport layer (ETL) 36 is provided between the light-emitting layer 35R and the second electrode 25.

In the present embodiment, an n-type semiconductor is used as the hole injection layer (HIL) 33. Note that an n-type oxide semiconductor is preferably used as the hole injection layer (HIL).

Note that in the present embodiment, an example is used in which the first electrode 22 and the hole injection layer (HIL) 33 are formed as separate layers of different materials. However, no such limitation is intended, and, for example, in a case where the hole injection layer (HIL) 33 is formed using indium tin oxide (ITO) or a similar transparent conductive film material having electrical conductivity, the first electrode 22 and the hole injection layer (HIL) 33 may be formed as a single layer of the same material.

Figure 1:
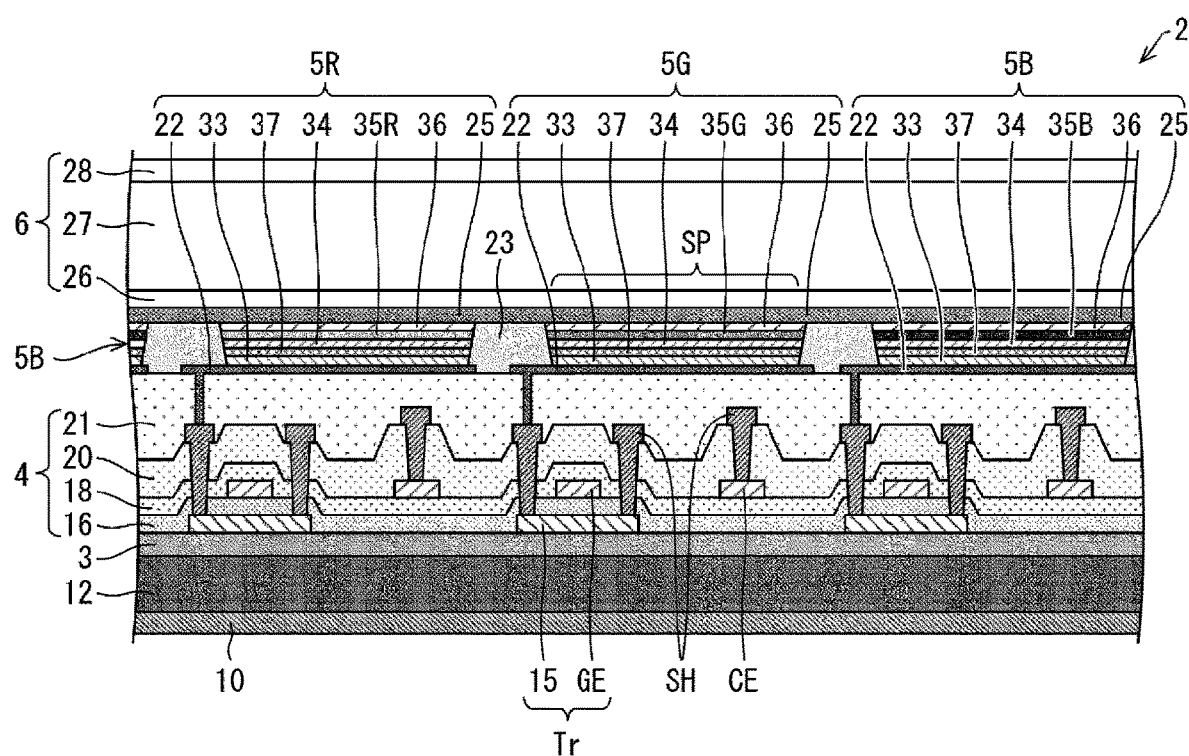
FIG. 1 is a diagram illustrating a schematic configuration of a display device including a light-emitting element according to a first embodiment.

FIG. 1 is a diagram illustrating a schematic configuration of a display device 2 including the light-emitting element 5R illustrated in FIG. 2.

As illustrated in FIG. 1, above the surface on one side of a substrate 10 of the display device 2, a resin layer 12, a barrier layer 3, a TFT layer 4, light-emitting elements 5R, 5G, 5B, and a sealing layer 6 are layered. Note that in the present specification, the direction from the substrate 10 to the light-emitting elements 5R, 5G, and 5B in FIG. 1 is referred to as the "upward direction", and the direction from the light-emitting layers 5R, 5G, and 5B to the substrate 10 is referred to as the "downward direction". In other words, "lower layer" means a layer that is formed in a process prior to that of a comparison layer, and "upper layer" means a layer that is formed in a process after that of a comparison layer. That is, relatively, the layer closer to the substrate 10 is the lower layer, and the layer farther from the substrate 10 is the upper layer.

Examples of the material of the substrate 10 include polyethylene terephthalate (PET), a glass substrate, and the like, but the material is not limited thereto. In the present embodiment, in order for the display device 2 to be a flexible display device, PET is used as the material of the substrate 10, but if the display device 2 is a non-flexible display device, a glass substrate or the like may be used.

Examples of the material of the resin layer 12 include a polyimide resin, an epoxy resin, and a polyamide resin, but are not limited thereto. In the present embodiment, the display device 2 is made as a flexible display device by radiating the resin layer 12 through a support substrate (not illustrated) with laser light and lowering the bonding strength between the support substrate (not illustrated) and the resin layer 12, peeling (laser lift off (LLO) process) the support substrate (not illustrated) from the resin layer 12, and adhering the substrate 10 made of PET to the surface of the resin layer 12 where the support substrate (not illustrated) was peeled off from. However, in a case where the display device 2 is a non-flexible display device or when the display device 2 is a flexible display device made by a method other than the LLO process, the resin layer 12 is not necessary.

The barrier layer 3 is a layer that inhibits moisture or impurities from reaching the TFT layer 4 or the light-emitting elements 5R, 5G, and 5B when the display device 2 is being used, and can be constituted by a silicon oxide film, a silicon nitride film, or a silicon oxynitride film, or by a layered film of these, for example, formed using chemical vapor deposition (CVD).

The TFT layer 4 includes a semiconductor film 15, an inorganic insulating film 16 (a gate insulating film) above the semiconductor film 15, a gate electrode GE above the inorganic insulating film 16, an inorganic insulating film 18 above the gate electrode GE, a capacitance wiring line CE above the inorganic insulating film 18, an inorganic insulating film 20 above the capacitance wiring line CE, a source-drain wiring line SH including a source-drain electrode above the inorganic insulating film 20, and a flattening film 21 above the source-drain wiring line SH.

A thin film transistor element Tr (TFT element) as an active element is configured so as to include the semiconductor film 15, the inorganic insulating film 16 (gate insulating film), the gate electrode GE, the inorganic insulating film 18, the inorganic insulating film 20, and the source-drain wiring line SH.

The semiconductor film 15 is formed of low-temperature polysilicon (LTPS) or an oxide semiconductor, for example. Note that FIG. 1 illustrates the TFT that has a top gate structure including the semiconductor film 15 as a channel, but the TFT may have a bottom gate structure.

The gate electrode GE, the capacitance electrode CE, and the source-drain wiring line SH are formed of, for example, a single film or a layered film of metal containing at least one of aluminum (Al), tungsten (W), molybdenum (Mo), tantalum (Ta), chromium (Cr), titanium (Ti), and copper (Cu).

The inorganic insulating films 16, 18, and 20 may be formed of, for example, a silicon oxide (SiOx) film, a silicon nitride (SiNx) film, or a silicon oxynitride film, or of a layered film of these, formed by CVD.

The flattening film (interlayer insulating film) 21 may be formed, for example, of a coatable photosensitive organic material, such as a polyimide resin and an acrylic resin.

In FIG. 2, only the schematic configuration of the light-emitting element 5R provided with the light-emitting layer 35R that emits light in a first wavelength range, i.e., the light-emitting layer 35R that emits red light is illustrated as an example of the light-emitting elements 5R, 5G, and 5B included in the display device 2. However, as illustrated in FIG. 1, the display device 2 also includes the light-emitting element 5G and the light-emitting element 5B in addition to the light-emitting element 5R. The light-emitting element 5G has the same configuration as the light-emitting element 5R except that a light-emitting layer 35G that emits light in a second wavelength range, i.e., a light-emitting layer 35G that emits green light is provided as a light-emitting layer. The light-emitting element 5B has the same configuration as the light-emitting element 5R except that a light-emitting layer 35B that emits light in a third wavelength range, i.e., a light-emitting layer 35B that emits blue light is provided as a light-emitting layer.

In the present embodiment, a case in which the light-emitting elements 5R, 5G, and 5B each include the same hole injection layer (HIL) 33, the same insulator layer 37, the same hole transport layer (HTL) 34, and the same electron transport layer (ETL) 36, but the disclosure is not limited thereto. For example, the hole injection layer (HIL) included in the light-emitting element 5R, the hole injection layer (HIL) included in the light-emitting element 5G, and the hole injection layer (HIL) included in the light-emitting element 5B may be made of different materials, or the same material may be used for two of the light-emitting elements with a different material being used for the remaining light-emitting element. Also, for example, the insulator layer included in the light-emitting element 5R, the insulator layer included in the light-emitting element 5G, and the insulator layer included in the light-emitting element 5B may be made of different materials, or the same material may be used for two of the light-emitting elements with a different material being used for the remaining light-emitting element. Furthermore, for example, the hole transport layer (HTL) included in the light-emitting element 5R, the hole transport layer (HTL) included in the light-emitting element 5G, and the hole transport layer (HTL) included in the light-emitting element 5B may be made of different materials, or the same material may be used for two of the light-emitting elements with a different material being used for the remaining light-emitting element. Also, for example, the electron transport layer (ETL) included in the light-emitting element 5R, the electron transport layer (ETL) included in the light-emitting element 5G, and the electron transport layer (ETL) included in the light-emitting element 5B may be made of different materials, or the same material may be used for two of the light-emitting elements with a different material being used for the remaining light-emitting element.

The light-emitting layer 35R that emits light in the first wavelength range, the light-emitting layer 35G that emits light in the second wavelength range, and the light-emitting layer 35B that emits light in the third wavelength range are different in terms of the central wavelength of the light emitted, and in the present embodiment, a case is described where the light-emitting layer 35R that emits light in the first wavelength range emits a red color, the light-emitting layer 35G that emits light in the second wavelength range emits a green color, and the light-emitting layer 35B that emits light in the third wavelength range emits a blue color, but no such limitation is intended.

Also, in the present embodiment, a case is described where the display device 2 includes the three types of light-emitting elements 5R, 5G, 5B that emit red, green, and blue light. However, no such limitation is intended, and two types of light-emitting elements may be provided that emit light of different color. Alternatively, the display device 2 may be provided with one type of light-emitting element.

The light-emitting layer 35R, the light-emitting layer 35G, and the light-emitting layer 35B are each light-emitting layers that include a quantum dot (nanoparticle) phosphor. Hereinafter, "phosphor" is omitted for the sake of simplicity and is simply referred to as quantum dots (nanoparticles). As the specific material of the quantum dot (nanoparticles), for example, any of CdSe/CdS, CdSe/ZnS, InP/ZnS, and CIGS/ZnS may be used, and the particle diameter of the quantum dots (nanoparticles) is around 3 to 10 nm. Note that, the light-emitting layer 35R, the light-emitting layer 35G, and the light-emitting layer 35B may use the quantum dots (nanoparticles) having different particle diameters or use quantum dots (nanoparticles) of different types from one another so that the light-emitting layers have central wavelengths of emitted light, which are different from one another.

In the present embodiment, a case where light-emitting layers including quantum dots (nanoparticles) are used as the light-emitting layer 35R, the light-emitting layer 35G, and the light-emitting layer 35B is given as an example, but the present embodiment is not limited thereto. As the light-emitting layer 35R, the light-emitting layer 35G, and the light-emitting layer 35B, OLED luminescent material may be used.

As illustrated in FIG. 1, each of the light-emitting elements 5R, 5G, and 5B has a configuration in which the first electrode 22, the hole injection layer (HIL) 33, the insulator layer 37, the hole transport layer (HTL) 34, one of the light-emitting layer 35R, the light-emitting layer 35G, or the light-emitting layer 35B, the electron transport layer (ETL) 36, and the second electrode 25 are layered in this order. Note that the layering order of the light-emitting elements 5R, 5G, and 5B from the first electrode 22 to the second electrode 25 may be reversed. In this case, in FIG. 1, the second electrode 25 is disposed at the position of the first electrode 22, and the first electrode 22 is disposed at the position of the second electrode 25. The material of the hole injection layer (HIL) 33, the insulator layer 37, the hole transport layer (HTL) 34, and the electron transport layer (ETL) 36 provided in the light-emitting elements 5R, 5G, and 5B will be described below. Note that each of the light-emitting elements 5R, 5G, and 5B is a subpixel SP of the display device 2.

The bank 23 that covers the edge of the first electrode 22 may be formed of, for example, a coatable photosensitive organic material such as a polyimide resin or an acrylic resin.

In the present embodiment, a case is described where the first electrode 22, the hole injection layer (HIL) 33, the insulator layer 37, the hole transport layer (HTL) 34, the light-emitting layer 35R, the light-emitting layer 35G, the light-emitting layer 35B, and the electron transport layer (ETL) 36 are formed into island shapes for each subpixel SP, with the second electrode 25 formed as a solid-like common layer, but no such limitation is intended. For example, except for the first electrode 22, the light-emitting layer 35R, the light-emitting layer 35G, and the light-emitting layer 35B, the hole injection layer (HIL) 33, the insulator layer 37, the hole transport layer (HTL) 34, and the electron transport layer (ETL) 36 may be formed as a solid-like common layer. Note that in this case, the bank 23 need not be provided.

In each of the light-emitting elements 5R, 5G, and 5B, the electron transport layer (ETL) 36 may not be formed.

The first electrode 22 is made of a conductive material. The second electrode 25 is formed of a conductive material and has a function as an electron injection layer (EIL) for injecting an electron in the electron transport layer (ETL) 36. Note that the electron injection layer may be further provided between the second electrode 25 and the electron transport layer (ETL) 36.

At least one of the first electrode 22 or the second electrode 25 is made of a light-transmissive material. Note that one of the first electrode 22 or the second electrode 25 may be formed from a light-reflective material. In a case where the display device 2 is a top-emitting display device, the second electrode 25 being an upper layer is formed of a light-transmissive material, and the first electrode 22 being a lower layer is formed of a light-reflective material. In a case where the display device 2 is a bottom-emitting display device, the second electrode 25 being an upper layer is formed of a light-reflective material, and the first electrode 22 being a lower layer is formed of a light-transmissive material. Note that in a case where the layering order from the first electrode 22 to the second electrode 25 is reversed, the display device 2 can be formed as a top-emitting display device by the first electrode 22, being an upper layer, being formed of a light-transmissive material and the second electrode 25, being a lower layer, being formed of a light-reflective material, or can be formed as a bottom-emitting display device by the first electrode 22, being an upper layer, being formed of a light-reflective material and the second electrode 25, being a lower layer, being formed of a light-transmissive material.

As the light-transmissive material, a transparent conductive film material can be used, for example. Specifically, Indium Tin Oxide (ITO), Indium Zinc Oxide (IZO), ZnO, aluminum-doped zinc oxide (AZO), boron-doped zinc oxide (BZO), or the like may be used. These materials have a high transmittance of visible light, and thus luminous efficiency is improved.

As the light-reflective material, a material with high visible light reflectivity such as a metal material is preferably used. Specifically, for example, Al, Cu, Au, Ag, or the like may be used. These materials have a high reflectivity of visible light, and thus luminous efficiency is improved.

In addition, an electrode with light reflectivity obtained by making either one of the first electrode 22 or the second electrode 25 a layered body including a light-transmissive material and a light-reflective material may be used.

Note that in the present embodiment, because the display device 2 is a top-emitting type, the second electrode 25 being an upper layer is formed of a light-transmissive material, and the first electrode 22 being a lower layer is formed of a light-reflective material.

Note that, although not illustrated in FIG. 1, the display device 2 further includes a control circuit that controls the light emission of the light-emitting elements 5R, 5G, and 5B.

With reference to FIGS. 3, 4, 15, and 16, the reason why the insulator layer 37 is provided between the hole injection layer (HIL) 33 and the hole transport layer (HTL) 34 in each of the light-emitting elements 5R, 5G, and 5B provided in the display device 2 will be described.

Figure 15:
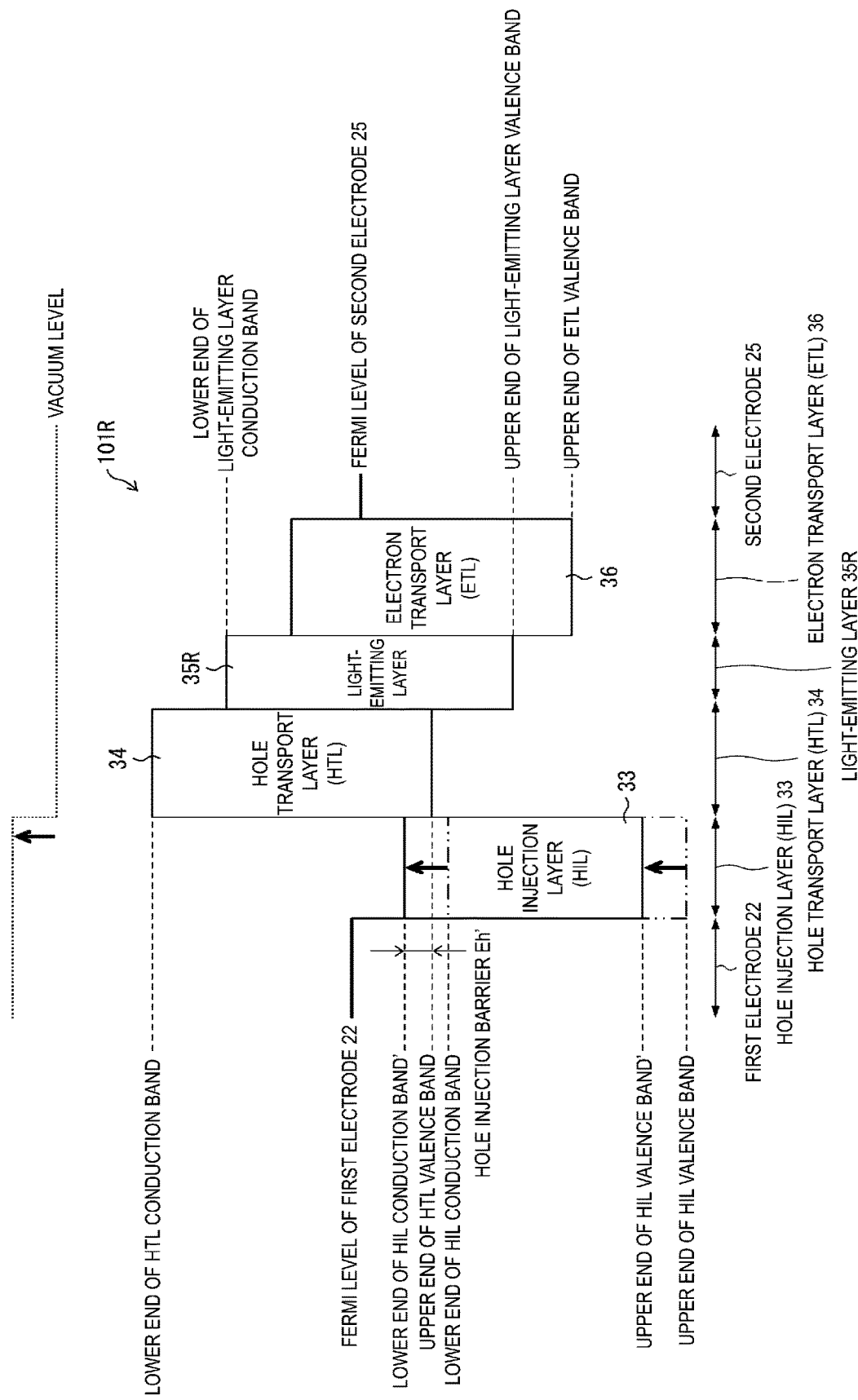
FIG. 15 is an energy band diagram for describing a hole injection barrier in a light-emitting element according to a comparative example.

FIG. 15 is an energy band diagram for describing a hole injection barrier Eh' in a light-emitting element 101R according to a comparative example.

Figure 17:
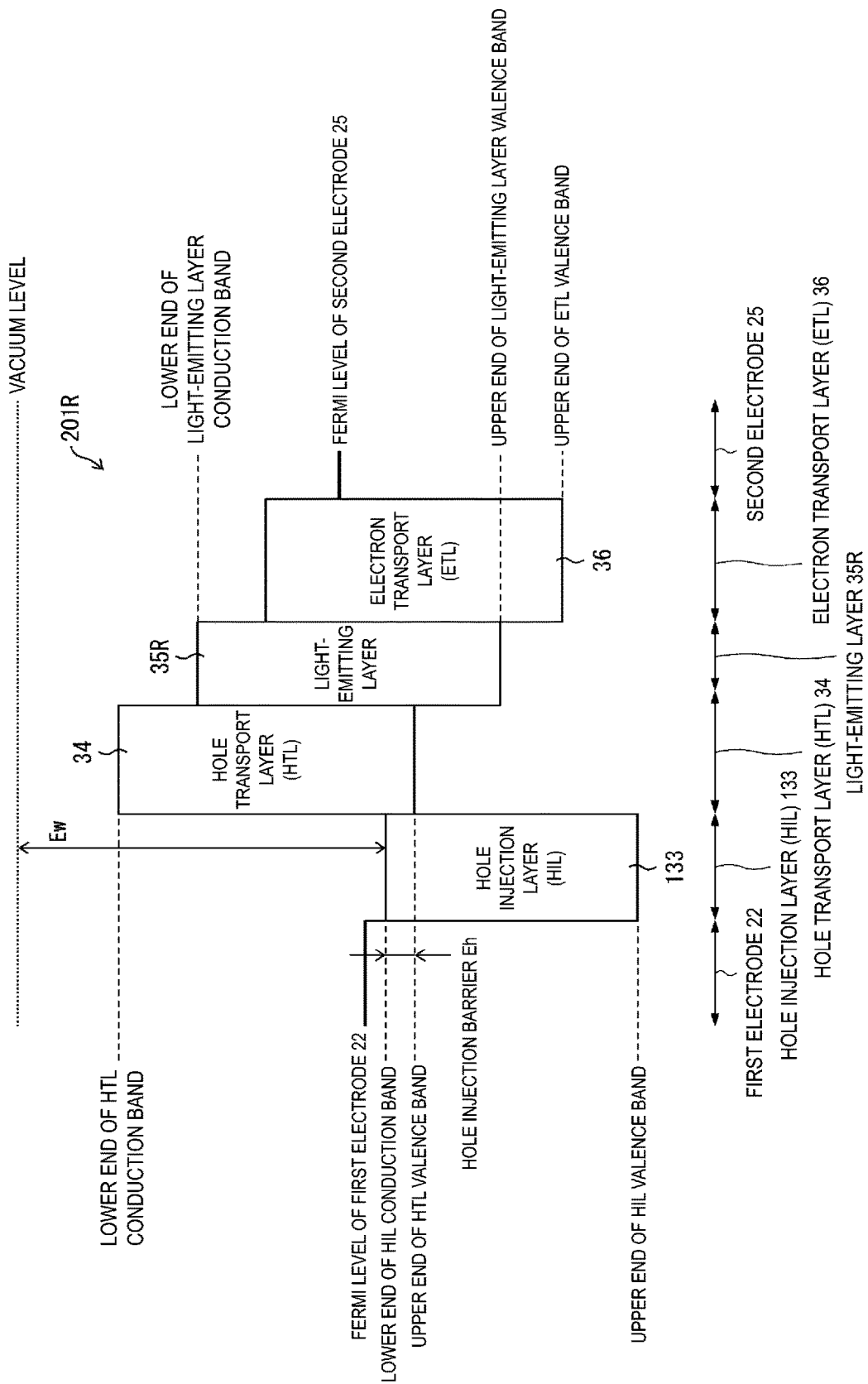
FIG. 17 is an energy band diagram for describing the reason as to why, in a known light-emitting element, hole injection to the light-emitting layer does not easily occur.

In the light-emitting element 101R according to the comparative example illustrated in FIG. 15, the material has a larger electron affinity compared with the hole injection layer (HIL) 133 with the electron affinity Ew provided in the known light-emitting element 201R illustrated in FIG. 17. For example, the hole injection layer (HIL) 33 used includes WOx, MoOx, and the like. The energy band diagram illustrated in FIG. 15 is a diagram illustrating an example where $MoO_3$ is used as the hole injection layer (HIL) 33 and NiO is used as the hole transport layer (HTL) 34, for example.

In FIG. 15, the upper end (upper end of the HIL valence band) of the valence band of the hole injection layer (HIL) 33 before the vacuum level shift occurs and the lower end (lower end of the HIL conduction band) of the conduction band of the hole injection layer (HIL) 33 before the vacuum level shift occurs are illustrated with a two-dot dash line, and the upper end (upper end of the HIL valence band') of the valence band of the hole injection layer (HIL) 33 after the vacuum level shift occurs and the lower end (lower end of the HIL conduction band') of the conduction band of the hole injection layer (HIL) 33 after the vacuum level shift occurs are illustrated with a solid line.

As illustrated in FIG. 15, the lower end (lower end or the HIL conduction band) of the conduction band of the hole injection layer (HIL) 33 before the vacuum level shift occurs is lower than the upper end (upper end of the HTL valence band) of the valence band of the hole transport layer (HTL) 34, meaning that the hole injection layer (HIL) 33 has a sufficiently large electron affinity. Thus, in the light-emitting element 101R according to the comparative example, the hole injection barrier at the interface between the hole injection layer (HIL) 33 and the hole transport layer (HTL) 34, or in other words the energy difference between the lower end (lower end of the HIL conduction band) of the conduction band of the hole injection layer (HIL) 33 and the upper end (upper end of the HTL valence band) of the valence band of the hole transport layer (HTL) 34 before vacuum level shift occurs, is small, meaning that efficient hole injection cannot be expected to be achieved. Specifically, in the case of FIG. 15, the energy difference between the lower end (lower end of the HIL conduction band) of the conduction band of the hole injection layer (HIL) 33 and the upper end (upper end of the HTL valence band) of the valence band of the hole transport layer (HTL) 34 before vacuum level shift occurs has a negative value, and it can be expected that the hole injection from the hole injection layer (HIL) 33 to the hole transport layer (HTL) 34 can be achieved without a hole injection barrier.

However, in the light-emitting element 101R according to the comparative example illustrated in FIG. 15, because the hole injection layer (HIL) 33 containing WOx, MoOx, or the like and the hole transport layer (HTL) 34 are in direct contact, the interface state formed at the interface between the hole injection layer (HIL) 33 and the hole transport layer (HTL) 34 causes a vacuum level shift to occur. As a result, the electron affinity of the hole injection layer (HIL) 33 is effectively reduced, and thus the hole injection barrier is larger than expected and the expected effect cannot be obtained. In other words, the hole injection from the hole injection layer (HIL) 33 to the hole transport layer (HTL) 34 is expected to be achieved without a hole injection barrier, but in practice, the hole injection barrier Eh', i.e., the energy difference between the upper end (upper end of the HIL valence band') of the valence band of the hole injection layer (HIL) 33 and the upper end (upper end of the HTL valence band) of the valence band of the hole transport layer (HTL) 34 after vacuum level shift occurs, is relatively largely present, making efficient hole injection unable to occur.

Figure 16:
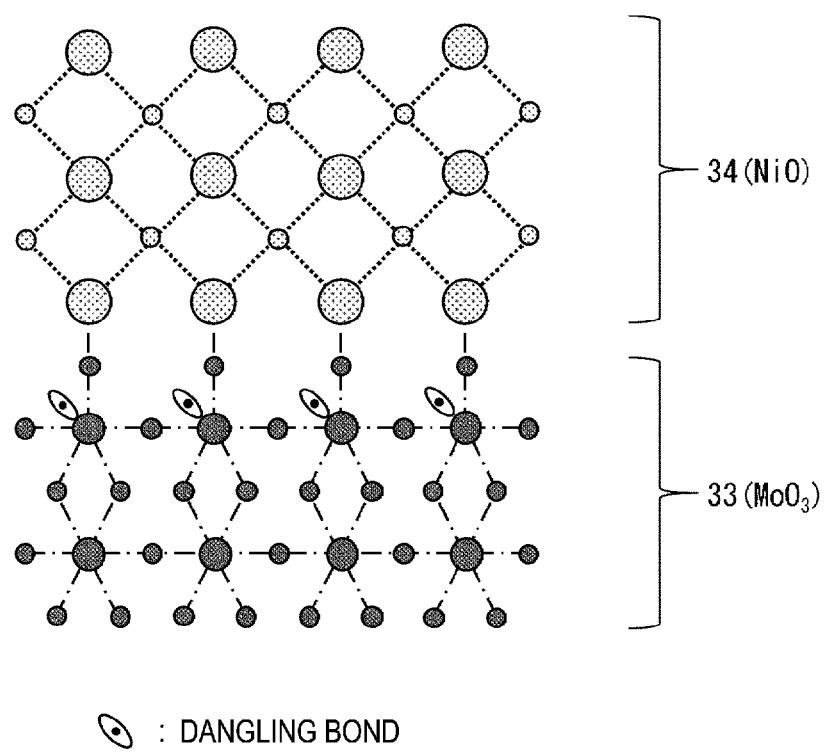
FIG. 16 is a schematic view illustrating the interface between a hole injection layer and a hole transport layer in the light-emitting element according to the comparative example illustrated in FIG. 15.

FIG. 16 is a schematic view illustrating the interface between the hole injection layer (HIL) 33 and the hole transport layer (HTL) 34 in the light-emitting element 101R according to the comparative example illustrated in FIG. 15. Note that the large circles in the hole injection layer (HIL) 33 in FIG. 16 indicate the Mo atoms and the small circles indicate O atoms and the large circles in the hole transport layer (HTL) 34 in FIG. 16 indicate the Ni atoms and the small circles indicate the O atoms.

In the case of the light-emitting element 101R according to the comparative example, $MoO_3$ is used as the hole injection layer (HIL) 33, and NiO is used as the hole transport layer (HTL) 34. At the interface between MoO$_3$ and NiO where MoO$_3$, which is the hole injection layer (HIL) 33, and NiO, which is the hole transport layer (HTL) 34, are formed in direct contact, the difference between the average oxidation number (+6) of the cations in MoO$_3$ and the average oxidation number (+2) of the cations in NiO is great. Thus, an Mo dangling bond is formed in the hole injection layer (HIL) 33, and an interface state is formed. As a result, a vacuum level shift occurs. Note that the reason why the vacuum level shift occurs is thought to be because Fermi level pinning occurs due to the interface state at the interface between the MoO$_3$, which is the hole injection layer (HIL) 33, and NiO, which is the hole transport layer (HTL) 34.

In the example described above, MoO$_3$ is used as the hole injection layer (HIL) 33 and NiO is used as the hole transport layer (HTL) 34, however, instead of using MoO$_3$ as the hole injection layer (HIL) 33, for example, WO$_3$ with an average oxidation number of the cations of (+6) may be used, and in this case, a W dangling bond is formed in the hole injection layer (HIL) 33, and an interface state is formed. Furthermore, instead of using NiO as the hole transport layer (HTL) 34, for example, Cu$_2$O with an average oxidation number of the cations of (+1) may be used, and in this case, because the difference between the average oxidation number of (+6) of the cations in the hole injection layer (HIL) 33 is even greater, Mo or W dangling bonds are easily formed in the hole injection layer (HIL) 33, and an interface state is easily formed. Also, in a case where an organic material is used as the hole transport layer (HTL) 34, the organic material is a molecule or a polymer, so there are almost no dangling bonds, and the oxidation number of the cations is considered to be zero. Accordingly, in a case where MoO$_3$ or WO$_3$ is used as the hole injection layer (HIL) 33 and an organic material is used as the hole transport layer (HTL) 34, the difference between the average oxidation number of (+6) of the cations in the hole injection layer (HIL) 33 and the oxidation number of (0) of the cations in the hole transport layer (HTL) 34 is even greater, Mo or W dangling bonds are more easily formed in the hole injection layer (HIL) 33, and an interface state is more easily formed.

Figure 3:
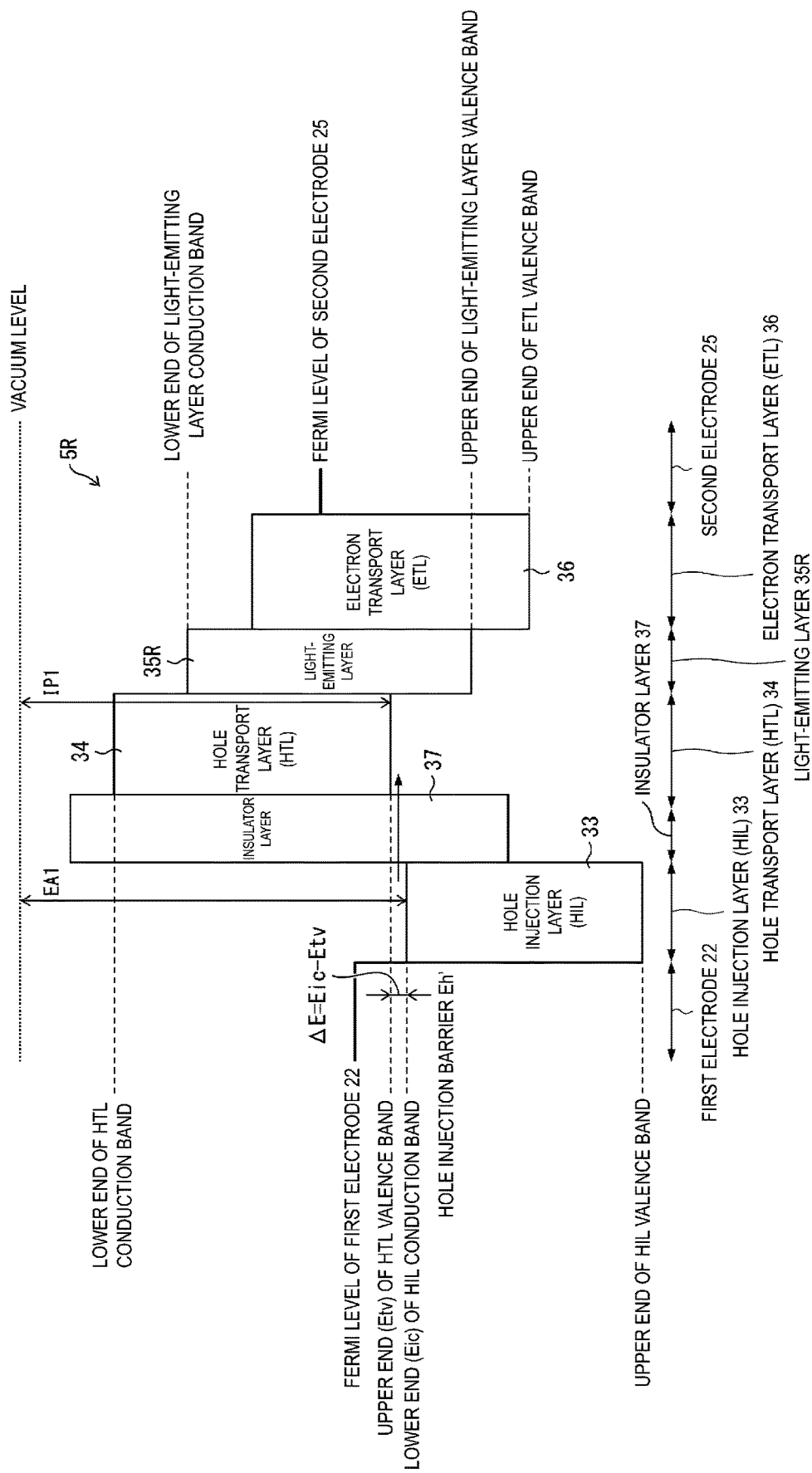
FIG. 3 is an energy band diagram for describing a hole injection barrier in the light-emitting element according the first embodiment.

FIG. 3 is an energy band diagram for describing a hole injection barrier Eh" in the light-emitting element 5R. Note that the energy band diagram illustrated in FIG. 3 is a diagram illustrating an example where MoO$_3$ is used as the hole injection layer (HIL) 33, NiO is used as the hole transport layer (HTL) 34, and SiO$_2$ is used as the insulator layer 37, for example.

As illustrated in FIG. 3, in the light-emitting element 5R, the insulator layer 37 is provided between the hole injection layer (HIL) 33 and the hole transport layer (HTL) 34, with the surface on one side in contact with the hole injection layer (HIL) 33 and the surface of the other side in contact with the hole transport layer (HTL) 34. Note that the average oxidation number of the cations in the material constituting the insulator layer 37 is greater than the average oxidation number of the cations in the material constituting the hole transport layer (HTL) 34 and is less than the average oxidation number of the cations in the material constituting the hole injection layer (HIL) 33.

In the light-emitting element 5R, by providing the insulator layer 37, the difference in the average oxidation number of the cations between the layers at the interface between the hole injection layer (HIL) 33 and the insulator layer 37 and at the interface between the insulator layer 37 and the hole transport layer (HTL) 34 can be reduced, allowing for formation of an interface state to be suppressed. As described above, in the light-emitting element 5R, by inserting the insulator layer 37, the formation of an interface state between the hole injection layer (HIL) 33 and the hole transport layer (HTL) 34 is suppressed, and a vacuum level shift is suppressed from occurring. Thus, in the light-emitting element 5R, efficient hole injection is possible.

Note that in a case where formation of an interface state is completely suppressed between the hole injection layer (HIL) 33 and the hole transport layer (HTL) 34, the hole injection barrier Eh" (=Eic-Etv) is equal to the difference between an electron affinity EA1 of the hole injection layer (HIL) 33 and an ionization potential IP1 of the hole transport layer (HTL) 34.

In FIG. 3, the lower side of the vacuum level is an energy level having all negative values, with the negative values increasing downward. Thus, the energy difference (ΔE=Eic-Etv) between the lower end (lower end (Eic) of the HIL conduction band) of the conduction band of the hole injection layer (HIL) 33 and the upper end (upper end (Etv) of the HTL valence band) of the valence band of the hole transport layer (HTL) 34, that is, the hole injection barrier Eh", is a negative value because both Eic and Etv are negative values and Etv>Eic. As a result, in the light-emitting element 5R illustrated in FIG. 3, the hole injection barrier Eh" is not present between the hole injection layer (HIL) 33 and the hole transport layer (HTL) 34, thus enabling efficient hole injection.

Specifically, in the example illustrated in FIG. 3 where formation of an interface state is completely suppressed (an example in which there is no vacuum level shift), Eic=-6.0 eV (MoO$_3$ electron affinity: 6.0 eV), and Etv=-5.2 eV (NiO ionization potential: 5.2 eV). Thus, the hole injection barrier Eh" between the hole injection layer and the hole transport layer=-0.8 eV.

In the example of the present embodiment described above, as illustrated in FIG. 3, the absolute value of the electron affinity EA1 of the hole injection layer (HIL) 33 is equal to or greater than the absolute value of the ionization potential IP1 of the hole transport layer (HTL) 34, that is the positive hole injection barrier Eh" (ΔE=Eic-Etv) has a negative value and the hole injection barrier Eh" is not present between the hole injection layer (HIL) 33 and the hole transport layer (HTL) 34. However, no such limitation is intended.

For example, the hole injection barrier Eh" (ΔE=Eic-Etv) is preferably from -1 eV to 0.26 eV. In a case where the hole injection barrier Eh" is greater than 0.26 eV, the hole injection from the hole injection layer to the hole transport layer is less likely to occur. In addition, in a case where the hole injection barrier Eh" is less than -1 eV, the built-in potential in the light-emitting element is excessively large, and the light emission voltage increases, which is not preferable. Also, the hole injection barrier Eh" (ΔE=Eic-Etv) is more preferably from -1 eV to 0 V. In the case of Eh"<0, efficient hole injection is possible due to a hole injection barrier not being present.

Figure 4:
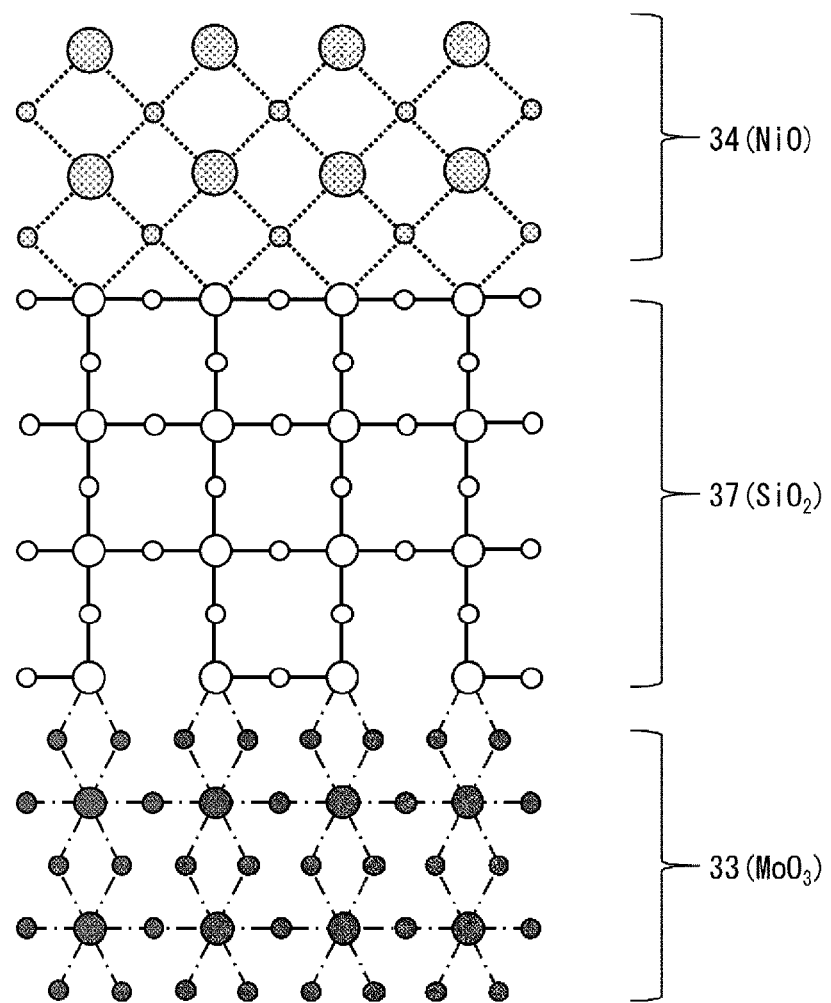
FIG. 4 is a schematic view illustrating the interface between a hole injection layer and an insulator layer and the interface between the insulator layer and a hole transport layer in the light-emitting element according to the first embodiment.

FIG. 4 is a schematic view illustrating the interface between the hole injection layer (HIL) 33 and the insulator layer 37 and the interface between the insulator layer 37 and the hole transport layer (HTL) 34 in the light-emitting element 5R. Note that the large circles in the hole injection layer (HIL) 33 in FIG. 4 indicate the Mo atoms and the small circles indicate O atoms, the large circles in the insulator layer 37 of FIG. 4 indicate Si atoms and the small circles indicate O atoms, and the large circles in the hole transport layer (HTL) 34 in FIG. 4 indicate the Ni atoms and the small circles indicate the O atoms.

In the present embodiment, $MoO_3$ is used as the hole injection layer (HIL) 33, NiO is used as the hole transport layer (HTL) 34, and $SiO_2$ is used as the insulator layer 37, for example.

As illustrated in FIG. 4, at the interface between the hole injection layer (HIL) 33 and the insulator layer 37, the difference between the average oxidation number (+6) of the cations in the hole injection layer (HIL) 33 and the average oxidation number (+4) of the cations in the insulator layer 37 is small, and thus Mo dangling bonds tend to not form in the hole injection layer (HIL) 33, and an interface state tends to not form. Similarly, even at the interface between the insulator layer 37 and the hole transport layer (HTL) 34, the difference between the average oxidation number (+4) of the cations in the insulator layer 37 and the average oxidation number (+2) of the cations in the hole transport layer (HTL) 34 is small, and thus Ni dangling bonds tend to not form in the hole transport layer (HTL) 34, and an interface state tends to not form. Thus, a vacuum level shift tends to not occur and the energy difference ($\Delta E = Eic - Etv$) between the lower end (lower end (Eic) of the HIL conduction band) of the conduction band of the hole injection layer (HIL) 33 and the upper end (upper end (Etv) of the HTL valence band) of the valence band of the hole transport layer (HTL) 34, that is, the hole injection barrier Eh", can be reduced. Thus, in the light-emitting element 5R, efficient hole injection is possible and a high luminous efficiency can be achieved.

Note that from the perspective of making tunneling of holes, i.e., the carriers, easier to occur, the thickness of the insulator layer 37 is preferably from 0.2 nm to 5 nm and more preferably from 0.5 nm to 3 nm.

FIG. 5 is a diagram listing examples of materials that can be used as the hole injection layer (HIL) 33, the insulator layer 37, and the hole transport layer (HTL) 34 provided in the light-emitting element 5R and the average oxidation number of the cations in the materials.

As listed in FIG. 5, regarding the material that can be used as the hole injection layer (HIL) 33, for example, the average oxidation number of Mo or W, i.e., the cations of molybdenum oxide (for example, $MoO_3$) and tungsten oxide (for example, $WO_3$) is +6, the average oxidation number of Sn, i.e., the cation of tin oxide (for example, $SnO_2$) is +4, and the average oxidation number of In, i.e., the cation of indium oxide (for example, $In_2O_3$) is +3.

Also, regarding the materials that can be used as the insulator layer 37, for example, the average oxidation number of Ta, i.e., the cation of tantalum oxide (for example, $Ta_2O_5$) is +5, the average oxidation number of Hf, Zr, Si, and Ge, i.e., the cations of hafnium oxide (for example, $HfO_2$), zirconium oxide (for example, $ZrO_2$), silicon oxide (for example, $SiO_2$), and germanium oxide (for example, $GeO_2$) is +4, the average oxidation number of Al, Ga, Y, and La, i.e., the cations of aluminum oxide (for example, $Al_2O_3$), gallium oxide (for example, $Ga_2O_3$), yttrium oxide (for example, $Y_2O_3$), and lanthanum oxide (for example, $La_2O_3$) is +3, and the average oxidation number of Sr and Mg, i.e., the cations of strontium oxide (for example, SrO) and magnesium oxide (for example, MgO) is +2.

Also, regarding the materials that can be used as the hole transport layer (HTL) 34, for example, with an organic material (PEDOT:PSS, PVK, TFB, NPD, and the like) containing molecules or polymers, almost no dangling bonds are formed, so the average oxidation number of the cations is considered to be zero. Also, regarding the materials that can be used as the hole transport layer (HTL) 34, for example, the average oxidation number of Cu, i.e., the cation of copper oxide (for example, $Cu_2O$) is +1 and the average oxidation number of Ni and Cu, i.e., the cations of nickel oxide (for example, NiO) and copper oxide (for example, CuO) is +2. Also, regarding the materials that can be used as the hole transport layer (HTL) 34, the oxidation number of Cu and Al, i.e., the cations of copper aluminate (for example, $CuAlO_2$), a composite oxide, is Cu (+1) and Al (+3). The composition ratio of Cu an Al is 1:1, and thus the average oxidation number of the cations contained in $CuAlO_2$ is obtained by finding the weighted average of the oxidation numbers of Cu and Al, which is +2.

Also, regarding the material used for the hole injection layer (HIL) 33, the insulator layer 37, or the hole transport layer (HTL) 34, in a case where the material is a compound contains na types of anions and nc types of cations, when the composition ratio of anions Ai (i=1, 2, 3, . . . , na) is ai, the oxidation number of anions Ai (i=1, 2, 3, . . . , na) is −ni, the composition ratio of cations Cj (j=1, 2, 3, . . . , nc) is cj, and $\Sigma ai + \Sigma cj = 1$, the average oxidation number of the cations in the compound is represented by the following Formula (A).

$$+\{\Sigma(ai \times ni)\}/(\Sigma cj) \qquad \text{Formula (A)}$$

However, the cations Cj contain an element of group 15 or 16 of the periodic table, the oxidation number of the anions containing an element of group 15 of the periodic table is −3, and the oxidation number of the anions containing an element of group 16 of the periodic table is −2.

FIG. 6 is a diagram listing example combinations of materials that can be used as the hole injection layer (HIL) 33, the insulator layer 37, and the hole transport layer (HTL) 34 provided in the light-emitting element 5R.

FIG. 7 is a diagram listing examples of materials that can be used as the hole injection layer (HIL) 33 provided in the light-emitting element 5R of the first embodiment illustrated in FIG. 5 and the electron affinity of each material.

As illustrated in FIG. 7, the electron affinity of molybdenum oxide ($MoO_3$) is 6.0 eV, the electron affinity of tungsten oxide ($WO_3$) is 6.0 eV, the electron affinity of tin oxide ($SnO_2$) is 4.5 eV, and the electron affinity of indium oxide ($In_2O_3$) is 5.3 eV.

FIG. 8 is a diagram listing examples of materials that can be used as the hole transport layer (HTL) 34 provided in the light-emitting element 5R of the first embodiment illustrated in FIG. 5 and the ionization potential of each material.

As illustrated in FIG. 8, the ionization potential of PEDOT:PSS is 5.2 eV, the ionization potential of PVK is 5.8 eV, the ionization potential of TFB is 5.3 eV, and the ionization potential of NPD is 5.5 eV. The ionization potential of copper oxide ($Cu_2O$) is 5.3 eV, the ionization potential of nickel oxide (NiO) is 5.2 eV, the ionization potential of copper oxide (CuO) is 5.4 eV, and the ionization potential of copper aluminate ($CuAlO_2$) is 5.3 eV.

All of the combination examples 1 to 9 listed in FIG. 6 satisfy the following Formula (B).

(Average oxidation number of the cations contained in hole injection layer 33)>(average oxidation number of the cations contained in insulator layer 37)>(average oxidation number of the cations contained in hole transport layer 34)    Formula (B)

In the case of combination example 1, as the hole injection layer (HIL) 33, molybdenum oxide (for example, $MoO_3$) or tungsten oxide (for example, $WO_3$) with an average oxidation number of the cations of +6 is used, for example. Also, as the insulator layer 37, tantalum oxide (for example, $Ta_2O_5$) with an average oxidation number of the cations of +5 may be used or hafnium oxide (for example, $HfO_2$), zirconium oxide (for example, $ZrO_2$), silicon oxide (for example, $SiO_2$), or germanium oxide (for example, GeO$_2$) with an average oxidation number of the cations of +4 may be used, for example. Furthermore, aluminum oxide (for example, Al$_2$O$_3$), gallium oxide (for example, Ga$_2$O$_3$), yttrium oxide (for example, Y$_2$O$_3$), or lanthanum oxide (for example, La$_2$O$_3$) with an average oxidation number of the cations of +3 may be used or strontium oxide (for example, SrO) or magnesium oxide (for example, MgO) with an average oxidation number of the cations of +2 may be used, for example. Also, as the hole transport layer (HTL) 34, an organic material (PEDOT:PSS, PVK, TFB, NPD, and the like) with essentially an average oxidation number of the cations of zero is used.

In the case of combination example 2, the same materials as in combination example 1 described above can be used for the hole injection layer (HIL) 33 and the insulator layer 37, and as the hole transport layer (HTL) 34, copper oxide (for example, Cu$_2$O) with an average oxidation number of the cations of +1 is used, for example.

In the case of combination example 3, the same materials as in combination example 1 and 2 described above can be used for the hole injection layer (HIL) 33. Also, as the insulator layer 37, tantalum oxide (for example, Ta$_2$O$_5$) with an average oxidation number of the cations of +5 may be used or hafnium oxide (for example, HfO$_2$), zirconium oxide (for example, ZrO$_2$), silicon oxide (for example, SiO$_2$), or germanium oxide (for example, GeO$_2$) with an average oxidation number of the cations of +4 may be used, for example. Furthermore, aluminum oxide (for example, Al$_2$O$_3$), gallium oxide (for example, Ga$_2$O$_3$), yttrium oxide (for example, Y$_2$O$_3$), or lanthanum oxide (for example, La$_2$O$_3$) with an average oxidation number of the cations of +3 may be used. Also, as the hole transport layer (HTL) 34, nickel oxide (for example, NiO) or copper oxide (for example, CuO) with an average oxidation number of the cations of +2 is used, for example.

In the case of combination example 4, the same materials as in combination examples 1 to 3 described above can be used for the hole injection layer (HIL) 33. Also, as the insulator layer 37, tantalum oxide (for example, Ta$_2$O$_5$) with an average oxidation number of the cations of +5 may be used or hafnium oxide (for example, HfO$_2$), zirconium oxide (for example, ZrO$_2$), silicon oxide (for example, SiO$_2$), or germanium oxide (for example, GeO$_2$) with an average oxidation number of the cations of +4 may be used, for example. Also, as the hole transport layer (HTL) 34, copper aluminate (for example, CuAlO$_2$), which is a composite oxide, with an average oxidation number of the cations of +2 is used, for example.

Note that in the case of combination examples 1 to 4 described above, by inserting the insulator layer 37, the formation of an interface state between the hole injection layer (HIL) 33 and the hole transport layer (HTL) 34 can be suppressed, and a vacuum level shift is suppressed from occurring. Thus, efficient hole injection is possible. Also, as the hole injection layer (HIL) 33, molybdenum oxide (for example, MoO$_3$) or tungsten oxide (for example, WO$_3$), which are oxides containing W or Mo, is used, for example. The absolute value of the electron affinity (energy difference between the vacuum level and the conduction band lower end) of the oxide containing W or Mo is equal to or greater than the absolute value of the ionization potential (energy difference between the vacuum level and the valence band upper end) of the hole transport layer (HTL) 34. Thus, the hole injection barrier, that is the energy difference between the conduction band lower end of the hole injection layer (HIL) 33 and the valence band upper end of the hole transport layer (HTL) 34, is zero or has a negative value and a hole injection barrier is not present between the hole injection layer (HIL) 33 and the hole transport layer (HTL) 34, thus enabling efficient hole injection.

Furthermore, in the case of combination example 5, as the hole injection layer (HIL) 33, tin oxide (for example, SnO$_2$) with an average oxidation number of the cations of +4 can be used, and as the insulator layer 37, aluminum oxide (for example, Al$_2$O$_3$), gallium oxide (for example, Ga$_2$O$_3$), yttrium oxide (for example, Y$_2$O$_3$), or lanthanum oxide (for example, La$_2$O$_3$) with an average oxidation number of the cations of +3 may be used or strontium oxide (for example, SrO) or magnesium oxide (for example, MgO) with an average oxidation number of the cations of +2 may be used, for example. Also, as the hole transport layer (HTL) 34, an organic material (PEDOT:PSS, PVK, TFB, NPD, and the like) with essentially an average oxidation number of the cations of zero is used.

In the case of combination example 6, the same materials as in combination example 5 described above can be used for the hole injection layer (HIL) 33 and the insulator layer 37, and as the hole transport layer (HTL) 34, copper oxide (for example, Cu$_2$O) with an average oxidation number of the cations of +1 is used, for example.

In the case of combination example 7, as the hole injection layer (HIL) 33, tin oxide (for example, SnO$_2$) with an average oxidation number of the cations of +4 can be used, and as the insulator layer 37, aluminum oxide (for example, Al$_2$O$_3$), gallium oxide (for example, Ga$_2$O$_3$), yttrium oxide (for example, Y$_2$O$_3$), or lanthanum oxide (for example, La$_2$O$_3$) with an average oxidation number of the cations of +3 is used. Also, as the hole transport layer (HTL) 34, nickel oxide (for example, NiO) or copper oxide (for example, CuO) with an average oxidation number of the cations of +2 is used, for example.

In the case of combination example 8, as the hole injection layer (HIL) 33, indium oxide (for example, In$_2$O$_3$) with an average oxidation number of the cations of +3 can be used, for example. In addition, indium tin oxide (ITO) may also be used as the hole injection layer (HIL) 33. ITO is an oxide containing In and Sn, and the most common atom other than oxide in the ITO is typically In, with the SnO$_2$ content in the ITO being approximately from 5 to 10 wt % and a large amount of In$_2$O$_3$ being contained. Thus, the average oxidation number of the cations in ITO is equal to or greater than +3. Also, as the insulator layer 37, strontium oxide (for example, SrO) or magnesium oxide (for example, MgO) may be used, for example. Also, as the hole transport layer (HTL) 34, an organic material (PEDOT:PSS, PVK, TFB, NPD, and the like) with essentially an average oxidation number of the cations of zero is used.

In the case of combination example 9, the same materials as in combination example 8 described above can be used for the hole injection layer (HIL) 33 and the insulator layer 37, and as the hole transport layer (HTL) 34, copper oxide (for example, Cu$_2$O) with an average oxidation number of the cations of +1 is used, for example.

Also in the case of combination examples 5 to 9 described above, by inserting the insulator layer 37, the formation of an interface state between the hole injection layer (HIL) 33 and the hole transport layer (HTL) 34 can be suppressed, and a vacuum level shift is suppressed from occurring. Thus, efficient hole injection is possible.

Note that in the case of combination examples 8 and 9 described above, when the hole injection layer (HIL) 33 is formed using indium tin oxide (ITO), which is a transparent conductive film material having electrical conductivity, the first electrode 22 and the hole injection layer (HIL) 33 may be formed as a single layer containing ITO.

The combination examples 1 to 9 listed in FIG. 6 are examples, and, as long as Formula (B) described above is satisfied, the hole injection layer (HIL) 33, the insulator layer 37, and the hole transport layer (HTL) 34 can be selected as appropriate.

As in the case of combination examples 1 to 4 described above, the hole injection layer (HIL) 33 preferably contains an oxide containing at least one of W or Mo. In a case where, as the hole injection layer (HIL) 33, molybdenum oxide (for example, $MoO_3$) or tungsten oxide (for example, $WO_3$), which are oxides containing W or Mo, is used, the absolute value of the electron affinity (energy difference between the vacuum level and the conduction band lower end) of the oxide containing W or Mo is equal to or greater than the absolute value of the ionization potential (energy difference between the vacuum level and the valence band upper end) of the hole transport layer (HTL) 34. Thus, the hole injection barrier, that is the energy difference between the conduction band lower end of the hole injection layer (HIL) 33 and the valence band upper end of the hole transport layer (HTL) 34, is zero or has a negative value and a hole injection barrier is not present between the hole injection layer (HIL) 33 and the hole transport layer (HTL) 34, thus enabling efficient hole injection.

In addition, as in the case of combination examples 5 to 9 described above, the hole injection layer (HIL) 33 may contain an oxide including Sn, and, as in the case of combination examples 5 to 7 described above, the hole injection layer (HIL) 33 may contain an oxide containing Sn as the most common atom other than oxygen.

The insulator layer 37 preferably contains an oxide, nitride, or oxynitride including one or more of Ta, Hf, Zr, Si, Ge, Al, Ga, Y, La, Sr, and Mg.

Note that as in combination examples 1 to 4 described above, in a case where the hole injection layer (HIL) 33 contains an oxide containing at least one of W or Mo, the relationship between the average oxidation number of the cations in the hole injection layer 33, the average oxidation number of the cations in the insulator layer 37, and the average oxidation number of the cations in the hole transport layer 34 is preferably set to satisfy the relationship of Formula (B) described above, with the insulator layer 37 preferably containing an oxide, a nitride, or an oxynitride containing one or more of Ta, Hf, Zr, Si, Ge, Al, Ga, Y, La, Sr, and Mg and the hole transport layer (HTL) 34 preferably containing an organic matter or an oxide containing one or more of Cu, Ni, and Al.

Also, as in combination examples 5 to 7 described above, in a case where the hole injection layer (HIL) 33 contains an oxide containing Sn as the most common atom other than oxygen, the relationship between the average oxidation number of the cations in the hole injection layer 33, the average oxidation number of the cations in the insulator layer 37, and the average oxidation number of the cations in the hole transport layer 34 is preferably set to satisfy the relationship of Formula (B) described above, with the insulator layer 37 preferably containing an oxide, a nitride, or an oxynitride containing one or more of Al, Ga, Y, La, Sr, and Mg and the hole transport layer (HTL) 34 preferably containing an organic matter or an oxide containing one or more of Cu and Ni.

Also, as in combination examples 8 and 9 described above, in a case where the hole injection layer (HIL) 33 contains an oxide containing In, the relationship between the average oxidation number of the cations in the hole injection layer 33, the average oxidation number of the cations in the insulator layer 37, and the average oxidation number of the cations in the hole transport layer 34 is preferably set to satisfy the relationship of Formula (B) described above, with the insulator layer 37 preferably containing an oxide, a nitride, or an oxynitride containing one or more of Sr and Mg and the hole transport layer (HTL) 34 preferably containing an organic matter or an oxide containing Cu.

Combination examples 1 to 9 described above are examples in which the insulator layer 37 is an oxide. However, no such limitation is intended, and a nitride or oxynitride using the same cations can be used as the insulator layer 37. For example, tantalum nitride, hafnium nitride, zirconium nitride, silicon nitride, germanium nitride, aluminum nitride, gallium nitride, yttrium nitride, lanthanum nitride, strontium nitride, magnesium nitride, tantalum oxynitride, hafnium oxynitride, zirconium oxynitride, silicon oxynitride, germanium oxynitride, aluminum oxynitride, gallium oxynitride, yttrium oxynitride, lanthanum oxynitride, strontium oxynitride, and magnesium oxynitride can be used for the insulator layer 37. Note that even in a case where a nitride or an oxynitride described above is used for the insulator layer 37, the relationship between the average oxidation number of the cations contained in the hole injection layer 33, the average oxidation number of the cations contained in the insulator layer 37, and the average oxidation number of the cations contained in the hole transport layer 34 satisfies the relationship of Formula (B) described above.

The hole injection layer (HIL) 33, the insulator layer 37, and the hole transport layer (HTL) 34 can be formed by a sputtering method, a vapor deposition method, a chemical vapor deposition (CVD) method, a physical vapor deposition (PVD) method, a sol-gel method, or the like. Note that when organic matter, i.e. organic material (PEDOT:PSS, PVK, TFB, NPD, and the like), is formed as the hole transport layer (HTL) 34, a coating method or the like may be used.

In the example of the present embodiment illustrated in FIGS. 2 and 3, the hole transport layer (HTL) 34 formed of PEDOT:PSS, PVK, TFB, NPD, NiO, $Cu_2O$, CuO, $CuAlO_2$, or the like is in contact with the light-emitting layer 35R. However, no such limitation is intended. PVK, TFB, NPD, or the like may be further provided between the hole transport layer (HTL) 34 and the light-emitting layer 35R in contact with the hole transport layer (HTL) 34 and the light-emitting layer 35R.

The insulator layer 37 is preferably a continuous film. In this example, the continuous film is a dense film having a porosity of less than 1%. In other words, the continuous film is a film with substantially no voids. The insulator layer 37 is preferably formed by a sputtering method, a vapor deposition method, a chemical vapor deposition method (CVD) method, a physical vapor deposition (PVD) method, or the like, and the insulator layer 37 formed by such a method is a continuous film, and thus a uniform hole injection can be achieved with a large contact area between the hole injection layer (HIL) 33 and the positive hole transport layer (HTL) 34. Note that, for example, a film made by applying microparticles such as nanoparticles cannot be a continuous film because of the porous nature due to a large number of voids being formed between the microparticles.

The insulator layer 37 may include an amorphous phase. In this case, film thickness uniformity is improved and uniform hole injection is possible. The insulator layer 37 may be constituted by an amorphous phase. In this case, film thickness uniformity is further improved and uniform hole injection is possible.

Additionally, in the example of the present embodiment illustrated in FIG. 1, the insulator layer 37 is provided as an island shape in each subpixel SP of the display device 2. However, no such limitation is intended, and the insulator layer 37 may be formed as a single common layer in the display device 2.

Second Embodiment

Next, a second embodiment of the disclosure will be described with reference to FIGS. 9 and 10. A light-emitting element 5R' of the present embodiment differs from that of the first embodiment in that an insulator layer 37' includes a first insulator layer 38 and a second insulator layer 39. Note that for convenience of explanation, components having the same functions as those described in diagrams of the first embodiment are appended with the same reference signs, and descriptions thereof may be omitted.

Figure 9:
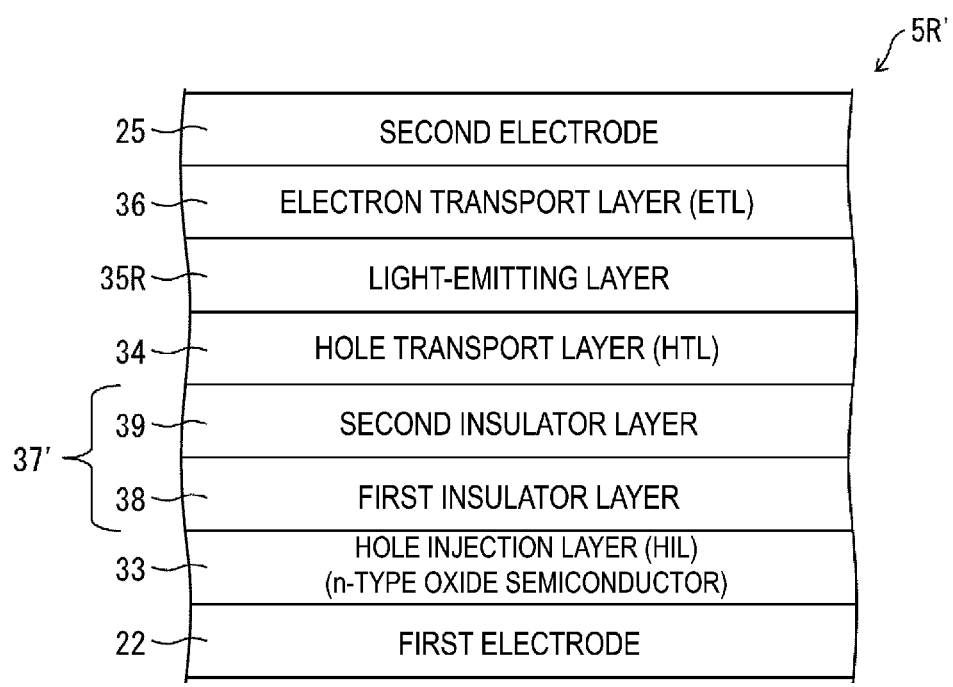
FIG. 9 is a diagram illustrating a schematic configuration of a light-emitting element according a second embodiment.

FIG. 9 is a diagram illustrating a schematic configuration of the light-emitting element 5R' according a second embodiment.

As illustrated in FIG. 9, the light-emitting element 5R' includes the first electrode 22, the second electrode (electron injection layer: EIL) 25, and the light-emitting layer 35R provided between the first electrode 22 and the second electrode 25. In other words, the first electrode 22 is an anode, and the second electrode 25 is a cathode. The hole injection layer (HIL) 33, the insulator layer 37', and the hole transport layer (HTL) 34 are layered in this order between the first electrode 22 and the light-emitting layer 35R from the first electrode 22 side. Also, the electron transport layer (ETL) 36 is provided between the light-emitting layer 35R and the second electrode 25. The insulator layer 37' includes the first insulator layer 38 and the second insulator layer 39. The first insulator layer 38 is provided between the hole injection layer (HIL) 33 and the second insulator layer 39 and is provided in contact with the hole injection layer (HIL) 33 and the second insulator layer 39. The second insulator layer 39 is provided between the first insulator layer 38 and the hole transport layer (HTL) 34, and is provided in contact with the first insulator layer 38 and the hole transport layer (HTL) 34.

The relationship between the average oxidation number of the cations contained in the hole injection layer 33, the average oxidation number of the cations contained in the insulator layer 37', and the average oxidation number of the cations contained in the hole transport layer 34 satisfies the relationship of the following Formula (C).

(Average oxidation number of the cations contained in hole injection layer 33)>(average oxidation number of the cations contained in insulator layer 37')>(average oxidation number of the cations contained in hole transport layer 34)   Formula (C)

Also, the first insulator layer 38 and the second insulator layer 39 contain different compounds containing one or more types of cations and one or more types of anions. The average oxidation number of the cations in the first insulator layer 38 and the average oxidation number of the cations in the second insulator layer 39 are each greater than the average oxidation number of the cations in the hole transport layer (HTL) 34 and each less than the average oxidation number of the cations in the hole injection layer (HIL) 33. The average oxidation number of the cations in the second insulator layer 39 is less than the average oxidation number of the cations in the first insulator layer 38.

FIG. 10 is a diagram listing example combinations of materials that can be used as the hole injection layer (HIL) 33, the first insulator layer 38 and the second insulator layer 39 forming the insulator layer 37', and the hole transport layer (HTL) 34 provided in the light-emitting element 5R'.

All of the combination examples 10 to 15 listed in FIG. 10 satisfy the Formula (C) described above.

In the case of combination example 10, as the hole injection layer (HIL) 33, molybdenum oxide (for example, $MoO_3$) or tungsten oxide (for example, $WO_3$) with an average oxidation number of the cations of +6 is used, for example. Also, as the first insulator layer 38 in the insulator layer 37', for example, tantalum oxide (for example, $Ta_2O_5$) with an average oxidation number of the cations of +5 is used. Also, as the second insulator layer 39 in the insulator layer 37', hafnium oxide (for example, $HfO_2$), zirconium oxide (for example, $ZrO_2$), silicon oxide (for example, $SiO_2$), or germanium oxide (for example, $GeO_2$) with an average oxidation number of the cations of +4 may be used, for example. Furthermore, aluminum oxide (for example, $Al_2O_3$), gallium oxide (for example, $Ga_2O_3$), yttrium oxide (for example, $Y_2O_3$), or lanthanum oxide (for example, $La_2O_3$) with an average oxidation number of the cations of +3 may be used or strontium oxide (for example, SrO) or magnesium oxide (for example, MgO) with an average oxidation number of the cations of +2 may be used, for example. Also, as the hole transport layer (HTL) 34, an organic material (PEDOT:PSS, PVK, TFB, NPD, and the like) with essentially an average oxidation number of the cations of zero may be used, or a copper oxide (for example, $Cu_2O$) with an average oxidation number of the cations of +1 may be used, for example.

In the case of combination example 11, the same materials as in combination example 10 described above can be used for the hole injection layer (HIL) 33, and as the first insulator layer 38 in the insulator layer 37', hafnium oxide (for example, $HfO_2$), zirconium oxide (for example, $ZrO_2$), silicon oxide (for example, $SiO_2$), or germanium oxide (for example, $GeO_2$) with an average oxidation number of the cations of +4 is used, for example. Furthermore, as the second insulator layer 39 in the insulator layer 37', aluminum oxide (for example, $Al_2O_3$), gallium oxide (for example, $Ga_2O_3$), yttrium oxide (for example, $Y_2O_3$), or lanthanum oxide (for example, $La_2O_3$) with an average oxidation number of the cations of +3 may be used or strontium oxide (for example, SrO) or magnesium oxide (for example, MgO) with an average oxidation number of the cations of +2 may be used, for example. Also, as the hole transport layer (HTL) 34, an organic material (PEDOT:PSS, PVK, TFB, NPD, and the like) with essentially an average oxidation number of the cations of zero may be used, or a copper oxide (for example, $Cu_2O$) with an average oxidation number of the cations of +1 may be used, for example.

In the case of combination example 12, as the hole injection layer (HIL) 33, the same materials as in combination example 10 described above can be used, and as the first insulator layer 38 in the insulator layer 37', aluminum oxide (for example, $Al_2O_3$), gallium oxide (for example, $Ga_2O_3$), yttrium oxide (for example, $Y_2O_3$), or lanthanum oxide (for example, $La_2O_3$) with an average oxidation number of the cations of +3 is used. Also, as the second insulator layer 39 of the insulator layer 37', strontium oxide (for example, SrO) or magnesium oxide (for example, MgO) with an average oxidation number of the cations of +2 is used, for example. Also, as the hole transport layer (HTL) 34, an organic material (PEDOT:PSS, PVK, TFB, NPD, and the like) with essentially an average oxidation number of the cations of zero may be used, or a copper oxide (for example, $Cu_2O$) with an average oxidation number of the cations of +1 may be used, for example.

In the case of combination example 13, the same materials as in combination example 10 described above can be used for the hole injection layer (HIL) 33, and first insulator layer 38 in the insulator layer 37', tantalum oxide (for example, $Ta_2O_5$) with an average oxidation number of the cations of +5 is used, for example. Also, as the second insulator layer 39 in the insulator layer 37', hafnium oxide (for example, $HfO_2$), zirconium oxide (for example, $ZrO_2$), silicon oxide (for example, $SiO_2$), or germanium oxide (for example, $GeO_2$) with an average oxidation number of the cations of +4 may be used, for example. Furthermore, aluminum oxide (for example, $Al_2O_3$), gallium oxide (for example, $Ga_2O_3$), yttrium oxide (for example, $Y_2O_3$), or lanthanum oxide (for example, $La_2O_3$) with an average oxidation number of the cations of +3 may be used. Also, as the hole transport layer (HTL) 34, nickel oxide (for example, NiO) or copper oxide (for example, CuO) with an average oxidation number of the cations of +2 is used, for example.

In the case of combination example 14, the same materials as in combination example 10 described above can be used for the hole injection layer (HIL) 33, and as the first insulator layer 38 in the insulator layer 37', hafnium oxide (for example, $HfO_2$), zirconium oxide (for example, $ZrO_2$), silicon oxide (for example, $SiO_2$), or germanium oxide (for example, $GeO_2$) with an average oxidation number of the cations of +4 is used, for example. Furthermore, as the second insulator layer 39 in the insulator layer 37', aluminum oxide (for example, $Al_2O_3$), gallium oxide (for example, $Ga_2O_3$), yttrium oxide (for example, $Y_2O_3$), or lanthanum oxide (for example, $La_2O_3$) with an average oxidation number of the cations of +3 is used. Also, as the hole transport layer (HTL) 34, nickel oxide (for example, NiO) or copper oxide (for example, CuO) with an average oxidation number of the cations of +2 may be used or copper aluminate (for example, $CuAlO_2$), which is a composite oxide, with an average oxidation number of the cations of +2 may be used, for example.

In the case of combination example 15, as the hole injection layer (HIL) 33, tin oxide (for example, $SnO_2$) with an average oxidation number of the cations of +4 can be used, and as the first insulator layer 38 in the insulator layer 37', aluminum oxide (for example, $Al_2O_3$), gallium oxide (for example, $Ga_2O_3$), yttrium oxide (for example, $Y_2O_3$), or lanthanum oxide (for example, $La_2O_3$) with an average oxidation number of the cations of +3 is used. Also, as the second insulator layer 39 of the insulator layer 37', strontium oxide (for example, SrO) or magnesium oxide (for example, MgO) with an average oxidation number of the cations of +2 is used, for example. Also, as the hole transport layer (HTL) 34, an organic material (PEDOT:PSS, PVK, TFB, NPD, and the like) with essentially an average oxidation number of the cations of zero may be used, or a copper oxide (for example, $Cu_2O$) with an average oxidation number of the cations of +1 may be used, for example.

Note that in the case of combination examples 10 to 14 described above, by inserting the insulator layer 37', the formation of an interface state between the hole injection layer (HIL) 33 and the hole transport layer (HTL) 34 can be suppressed, and a vacuum level shift is suppressed from occurring. Thus, efficient hole injection is possible. Also, as the hole injection layer (HIL) 33, molybdenum oxide (for example, $MoO_3$) or tungsten oxide (for example, $WO_3$), which are oxides containing W or Mo, is used, for example. The absolute value of the electron affinity (energy difference between the vacuum level and the conduction band lower end) of the oxide containing W or Mo is equal to or greater than the absolute value of the ionization potential (energy difference between the vacuum level and the valence band upper end) of the hole transport layer (HTL) 34. Thus, the hole injection barrier, that is the energy difference between the conduction band lower end of the hole injection layer (HIL) 33 and the valence band upper end of the hole transport layer (HTL) 34, is zero or has a negative value and a hole injection barrier is not present between the hole injection layer (HIL) 33 and the hole transport layer (HTL) 34, thus enabling efficient hole injection.

Also, in the case of combination example 15 described above, by inserting the insulator layer 37', the formation of an interface state between the hole injection layer (HIL) 33 and the hole transport layer (HTL) 34 can be suppressed, and a vacuum level shift is suppressed from occurring. Thus, efficient hole injection is possible.

Combination examples 10 to 15 listed in FIG. 10 are examples, and as long as Formula (C) described above is satisfied and the average oxidation number of the cations in the first insulator layer 38 and the average oxidation number of the cations in the second insulator layer 39 are each greater than the average oxidation number of the cations in the hole transport layer (HTL) 34 and each less than the average oxidation number of the cations in the hole injection layer (HIL) 33 and the average oxidation number of the cations in the second insulator layer 39 is less than the average oxidation number of the cations in the first insulator layer 38, the hole injection layer (HIL) 33, the first insulator layer 38, the second insulator layer 39, and the hole transport layer (HTL) 34 can be selected as appropriate.

As in the first embodiment, indium oxide (for example, $In_2O_3$) or indium tin oxide (ITO) may be used for the hole injection layer (HIL) 33, for example.

The insulator layer 37' preferably contains an oxide, nitride, or oxynitride including one or more of Ta, Hf, Zr, Si, Ge, Al, Ga, Y, La, Sr, and Mg.

Note that as in combination examples 10 to 14 described above, in a case where the hole injection layer (HIL) 33 contains an oxide containing at least one of W or Mo, so that the average oxidation number of the cations in the first insulator layer 38 and the average oxidation number of the cations in the second insulator layer 39 are each greater than the average oxidation number of the cations in the hole transport layer (HTL) 34 and less than the average oxidation number of the cations in the hole injection layer (HIL) 33 and the average oxidation number of the cations in the second insulator layer 39 is less than the average oxidation number of the cations in the first insulator layer 38, the first insulator layer 38 preferably contains an oxide, a nitride, or an oxynitride containing one or more of Ta, Hf, Zr, Si, Ge, Al, Ga, Y, and La and the second insulator layer 39 preferably contains an oxide, a nitride, or an oxynitride containing one or more of Hf, Zr, Si, Ge, Al, Ga, Y, La, Sr, and Mg. Furthermore, the hole transport layer (HTL) 34 preferably contains an organic matter or an oxide containing one or more of Cu, Ni, and Al.

Also, as in combination example 15 described above, in a case where the hole injection layer (HIL) 33 contains an oxide Sn as the most common atom other than oxygen, so that the average oxidation number of the cations in the first insulator layer 38 and the average oxidation number of the cations in the second insulator layer 39 are each greater than the average oxidation number of the cations in the hole transport layer (HTL) 34 and less than the average oxidation number of the cations in the hole injection layer (HIL) 33 and the average oxidation number of the cations in the second insulator layer 39 is less than the average oxidation number of the cations in the first insulator layer 38, the first insulator layer 38 preferably contains an oxide, a nitride, or an oxynitride containing one or more of Al, Ga, Y, and La and the second insulator layer 39 preferably contains an oxide, a nitride, or an oxynitride containing one or more of Sr and Mg. Furthermore, the hole transport layer (HTL) 34 preferably contains an organic matter or an oxide containing Cu.

Note that from the perspective of making tunneling of holes, i.e., the carriers, easier to occur, the thickness of the insulator layer 37', i.e., the combined thickness of the first insulator layer 38 and the second insulator layer 39, is preferably from 0.2 nm to 5 nm and more preferably from 0.5 nm to 3 nm.

Combination examples 10 to 15 described above are examples in which the first insulator layer 38 and the second insulator layer 39 are oxides. However, no such limitation is intended, and a nitride or oxynitride using the same cations can be used as the first insulator layer 38 and the second insulator layer 39. For example, tantalum nitride, hafnium nitride, zirconium nitride, silicon nitride, germanium nitride, aluminum nitride, gallium nitride, yttrium nitride, lanthanum nitride, strontium nitride, magnesium nitride, tantalum oxynitride, hafnium oxynitride, zirconium oxynitride, silicon oxynitride, germanium oxynitride, aluminum oxynitride, gallium oxynitride, yttrium oxynitride, lanthanum oxynitride, strontium oxynitride, and magnesium oxynitride can be used for the first insulator layer 38 and the second insulator layer 39. Note that even in a case where a nitride or an oxynitride described above is used for the first insulator layer 38 and the second insulator layer 39, the relationship between the average oxidation number of the cations contained in the hole injection layer 33, the average oxidation number of the cations contained in the insulator layer 37', and the average oxidation number of the cations contained in the hole transport layer 34 satisfies the relationship of Formula (C) described above. Specifically, the insulator layer 37' includes the first insulator layer 38 and the second insulator layer 39, and thus the relationship of the following Formula (C') is satisfied.

(Average oxidation number of the cations contained in hole injection layer 33)>(average oxidation number of the cations contained in first insulator layer 38)>(average oxidation number of the cations contained in second insulator layer 39)>(average oxidation number of the cations contained in hole transport layer 34)  Formula (C')

Also, the average oxidation number of the cations in the first insulator layer 38 and the average oxidation number of the cations in the second insulator layer 39 are each greater than the average oxidation number of the cations in the hole transport layer (HTL) 34 and each less than the average oxidation number of the cations in the hole injection layer (HIL) 33, and the average oxidation number of the cations in the second insulator layer 39 is less than the average oxidation number of the cations in the first insulator layer 38.

The insulator layer 37' preferably includes a continuous film. That is the first insulator layer 38 and/or the second insulator layer 39 is preferably a continuous film. The first insulator layer 38 and/or the second insulator layer 39 is preferably formed by a sputtering method, a vapor deposition method, a chemical vapor deposition method (CVD) method, a physical vapor deposition (PVD) method, or the like, and the first insulator layer 38 and/or the second insulator layer 39 formed by such a method is a continuous film, and thus a large contact area with in-contact layers and uniform hole injection can be achieved.

The insulator layer 37' may include an amorphous phase. In other words, the first insulator layer 38 and/or the second insulator layer 39 may include an amorphous phase. In this case, film thickness uniformity is improved and uniform hole injection is possible. The first insulator layer 38 and the second insulator layer 39 may be constituted by an amorphous phase. In this case, film thickness uniformity is further improved and uniform hole injection is possible.

Additionally, in the present embodiment, the first insulator layer 38 and the second insulator layer 39, i.e., the insulator layer 37', are provided as island shapes. However, no such limitation is intended, and the first insulator layer 38 and/or the second insulator layer 39 may be formed as a single common layer in the display device 2.

Third Embodiment

Next, a third embodiment of the disclosure will be described with reference to FIG. 11 and FIG. 12. A light-emitting element 5R" of the present embodiment differs from that of the first and second embodiment in that an insulator layer 37" includes a first insulator layer 40, a second insulator layer 41, and a third insulator layer 42. Note that for convenience of explanation, components having the same functions as those described in diagrams of the first and second embodiment are appended with the same reference signs, and descriptions thereof may be omitted.

Figure 11:
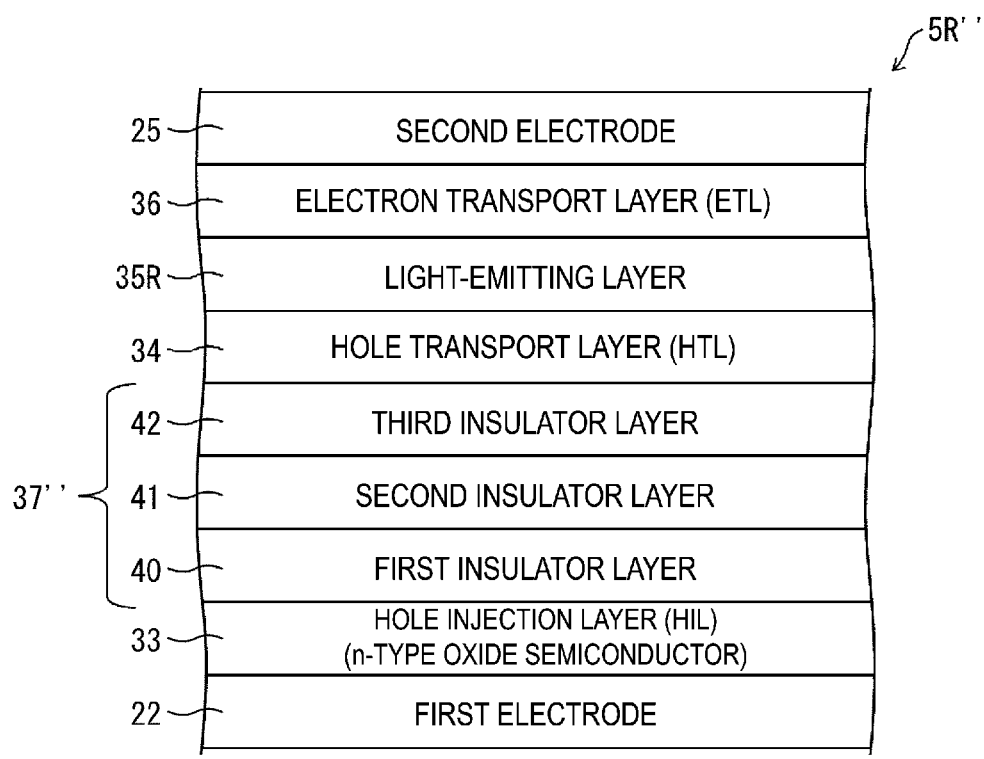
FIG. 11 is a diagram illustrating a schematic configuration of a light-emitting element according a third embodiment.

FIG. 11 is a diagram illustrating a schematic configuration of the light-emitting element 5R" according the third embodiment.

As illustrated in FIG. 11, the light-emitting element 5R" includes the first electrode 22, the second electrode (electron injection layer: EIL) 25, and the light-emitting layer 35R provided between the first electrode 22 and the second electrode 25. In other words, the first electrode 22 is an anode, and the second electrode 25 is a cathode. The hole injection layer (HIL) 33, the insulator layer 37", and the hole transport layer (HTL) 34 are layered in this order between the first electrode 22 and the light-emitting layer 35R from the first electrode 22 side. Also, the electron transport layer (ETL) 36 is provided between the light-emitting layer 35R and the second electrode 25. The insulator layer 37" includes the first insulator layer 40, the second insulator layer 41, and the third insulator layer 42. The first insulator layer 40 is provided between the hole injection layer (HIL) 33 and the second insulator layer 41 and is provided in contact with the hole injection layer (HIL) 33 and the second insulator layer 41. The second insulator layer 41 is provided between the first insulator layer 40 and the third insulator layer 42, and is provided in contact with the first insulator layer 40 and the third insulator layer 42. The third insulator layer 42 is provided between the second insulator layer 41 and the hole transport layer (HTL) 34, and is provided in contact with the second insulator layer 41 and the hole transport layer (HTL) 34.

The relationship between the average oxidation number of the cations contained in the hole injection layer 33, the average oxidation number of the cations contained in the insulator layer 37", and the average oxidation number of the cations contained in the hole transport layer 34 satisfies the relationship of the following Formula (D).

Average oxidation number of the cations contained in hole injection layer 33>average oxidation number of the cations contained in insulator layer 37">average oxidation number of the cations contained in hole transport layer 34      Formula (D)

Also, the first insulator layer 40, the second insulator layer 41, and the third insulator layer 42 contain different compounds containing one or more types of cations and one or more types of anions. The average oxidation number of the cations in the first insulator layer 40, the average oxidation number of the cations in the second insulator layer 41, and the average oxidation number of the cations in the third insulator layer 42 are each greater than the average oxidation number of the cations in the hole transport layer (HTL) 34 and each less than the average oxidation number of the cations in the hole injection layer (HIL) 33. Also, the average oxidation number of the cations in the third insulator layer 42 is less than the average oxidation number of the cations in the second insulator layer 41, and the average oxidation number of the cations in the second insulator layer 41 is less than the average oxidation number of the cations in the first insulator layer 40. Specifically, the insulator layer 37" includes the first insulator layer 40, the second insulator layer 41, and the third insulator layer 42, and thus the relationship of the following Formula (D') is satisfied.

(Average oxidation number of the cations contained in hole injection layer 33)>(average oxidation number of the cations contained in first insulator layer 40)>(average oxidation number of the cations contained in second insulator layer 41)>(average oxidation number of the cations contained in third insulator layer 42)>(average oxidation number of the cations contained in hole transport layer 34)      Formula (D')

FIG. 12 is a diagram listing example combinations of materials that can be used as the hole injection layer (HIL) 33, the first insulator layer 40, the second insulator layer 41, and the third insulator layer 42 forming the insulator layer 37", and the hole transport layer (HTL) 34 provided in the light-emitting element 5R".

All of the combination examples 16 to 18 listed in FIG. 12 satisfy the Formula (D) described above.

In the case of combination example 16, as the hole injection layer (HIL) 33, molybdenum oxide (for example, $MoO_3$) or tungsten oxide (for example, $WO_3$) with an average oxidation number of the cations of +6 is used, for example. Also, as the first insulator layer 40 in the insulator layer 37", for example, tantalum oxide (for example, $Ta_2O_5$) with an average oxidation number of the cations of +5 is used. Also, as the second insulator layer 41 in the insulator layer 37", hafnium oxide (for example, $HfO_2$), zirconium oxide (for example, $ZrO_2$), silicon oxide (for example, $SiO_2$), or germanium oxide (for example, $GeO_2$) with an average oxidation number of the cations of +4 is used, for example. Furthermore, as the third insulator layer 42 in the insulator layer 37", aluminum oxide (for example, $Al_2O_3$), gallium oxide (for example, $Ga_2O_3$), yttrium oxide (for example, $Y_2O_3$), or lanthanum oxide (for example, $La_2O_3$) with an average oxidation number of the cations of +3 may be used or strontium oxide (for example, SrO) or magnesium oxide (for example, MgO) with an average oxidation number of the cations of +2 may be used, for example. Also, as the hole transport layer (HTL) 34, an organic material (PEDOT:PSS, PVK, TFB, NPD, and the like) with essentially an average oxidation number of the cations of zero may be used, or a copper oxide (for example, $Cu_2O$) with an average oxidation number of the cations of +1 may be used, for example.

In the case of combination example 17, the same materials as in combination example 16 described above can be used for the hole injection layer (HIL) 33, and as the first insulator layer 40 in the insulator layer 37", hafnium oxide (for example, $HfO_2$), zirconium oxide (for example, $ZrO_2$), silicon oxide (for example, $SiO_2$), or germanium oxide (for example, $GeO_2$) with an average oxidation number of the cations of +4 is used, for example. Furthermore, as the second insulator layer 41 in the insulator layer 37", aluminum oxide (for example, $Al_2O_3$), gallium oxide (for example, $Ga_2O_3$), yttrium oxide (for example, $Y_2O_3$), or lanthanum oxide (for example, $La_2O_3$) with an average oxidation number of the cations of +3 is used. Also, as the third insulator layer 42 of the insulator layer 37", strontium oxide (for example, SrO) or magnesium oxide (for example, MgO) with an average oxidation number of the cations of +2 is used, for example. Also, as the hole transport layer (HTL) 34, an organic material (PEDOT:PSS, PVK, TFB, NPD, and the like) with essentially an average oxidation number of the cations of zero may be used, or a copper oxide (for example, $Cu_2O$) with an average oxidation number of the cations of +1 may be used, for example.

In the case of combination example 18, the same materials as in combination example 16 described above can be used for the hole injection layer (HIL) 33, and first insulator layer 40 in the insulator layer 37", tantalum oxide (for example, $Ta_2O_5$) with an average oxidation number of the cations of +5 is used, for example. Also, as the second insulator layer 41 in the insulator layer 37", hafnium oxide (for example, $HfO_2$), zirconium oxide (for example, $ZrO_2$), silicon oxide (for example, $SiO_2$), or germanium oxide (for example, $GeO_2$) with an average oxidation number of the cations of +4 is used, for example. Furthermore, as the third insulator layer 42 in the insulator layer 37", aluminum oxide (for example, $Al_2O_3$), gallium oxide (for example, $Ga_2O_3$), yttrium oxide (for example, $Y_2O_3$), or lanthanum oxide (for example, $La_2O_3$) with an average oxidation number of the cations of +3 is used. Also, as the hole transport layer (HTL) 34, nickel oxide (for example, NiO) or copper oxide (for example, CuO) with an average oxidation number of the cations of +2 is used, for example.

Note that in the case of combination examples 16 to 18 described above, by inserting the insulator layer 37", the formation of an interface state between the hole injection layer (HIL) 33 and the hole transport layer (HTL) 34 can be suppressed, and a vacuum level shift is suppressed from occurring. Thus, efficient hole injection is possible. Also, as the hole injection layer (HIL) 33, molybdenum oxide (for example, $MoO_3$) or tungsten oxide (for example, $WO_3$), which are oxides containing W or Mo, is used, for example. The absolute value of the electron affinity (energy difference between the vacuum level and the conduction band lower end) of the oxide containing W or Mo is equal to or greater than the absolute value of the ionization potential (energy difference between the vacuum level and the valence band upper end) of the hole transport layer (HTL) 34. Thus, the hole injection barrier, that is the energy difference between the conduction band lower end of the hole injection layer (HIL) 33 and the valence band upper end of the hole transport layer (HTL) 34, is zero or has a negative value and a hole injection barrier is not present between the hole injection layer (HIL) 33 and the hole transport layer (HTL) 34, thus enabling efficient hole injection.

Combination examples 16 to 18 listed in FIG. 12 are examples, and as long as Formula (D') described above is satisfied and the average oxidation number of the cations in the first insulator layer 40, the average oxidation number of the cations in the second insulator layer 41, and the average oxidation number of the cations in the third insulator layer 42 are each greater than the average oxidation number of the cations in the hole transport layer (HTL) 34 and each less than the average oxidation number of the cations in the hole injection layer (HIL) 33, the average oxidation number of the cations in the third insulator layer 42 is less than the average oxidation number of the cations in the second insulator layer 41, and the average oxidation number of the cations in the second insulator layer 41 is less than the average oxidation number of the cations in the first insulator layer 40, the hole injection layer (HIL) 33, the first insulator layer 40, the second insulator layer 41, the third insulator layer 42, and the hole transport layer (HTL) 34 can be selected as appropriate. In other words, so that the average oxidation number of the cations in the hole transport layer (HTL) 34 is less than the average oxidation number of the cations in the third insulator layer 42, the average oxidation number of the cations in the third insulator layer 42 is less than the average oxidation number of the cations in the second insulator layer 41, the average oxidation number of the cations in the second insulator layer 41 is less than the average oxidation number of the cations in the first insulator layer 40, and the average oxidation number of the cations in the first insulator layer 40 is less than the average oxidation number of the cations in the hole injection layer (HIL) 33, the materials for the hole injection layer (HIL) 33, the first insulator layer 40, the second insulator layer 41, the third insulator layer 42, and the hole transport layer (HTL) 34 may be selected as appropriate.

The insulator layer 37" preferably contains an oxide, nitride, or oxynitride including one or more of Ta, Hf, Zr, Si, Ge, Al, Ga, Y, La, Sr, and Mg.

Note that as in combination examples 16 to 18 described above, in a case where the hole injection layer (HIL) 33 contains an oxide containing at least one of W or Mo, so that the average oxidation number of the cations in the third insulator layer 42 is less than the average oxidation number of the cations in the second insulator layer 41 and the average oxidation number of the cations in the second insulator layer 41 is less than the average oxidation number of the cations in the first insulator layer 40, the first insulator layer 40 preferably contains an oxide, a nitride, or an oxynitride containing one or more of Ta, Hf, Zr, Si, and Ge, the second insulator layer 41 preferably contains an oxide, a nitride, or an oxynitride containing one or more of Hf, Zr, Si, Ge, Al, Ga, Y, and La, and the third insulator layer 42 preferably contains an oxide, a nitride, or an oxynitride containing one or more of Al, Ga, Y, La, Sr, and Mg. The hole transport layer preferably contains an organic matter or an oxide containing one or more of Cu and Ni.

Note that from the perspective of making tunneling of holes, i.e., the carriers, easier to occur, the thickness of the insulator layer 37", i.e., the combined thickness of the first insulator layer 40, the second insulator layer 41, and the third insulator layer 42, is preferably from 0.2 nm to 5 nm and more preferably from 0.5 nm to 3 nm.

Combination examples 16 to 18 described above are examples in which the first insulator layer 40, the second insulator layer 41, and the third insulator layer 42 are oxides. However, no such limitation is intended, and a nitride or oxynitride using the same cations can be used as the first insulator layer 40, the second insulator layer 41, and the third insulator layer 42. For example, tantalum nitride, hafnium nitride, zirconium nitride, silicon nitride, germanium nitride, aluminum nitride, gallium nitride, yttrium nitride, lanthanum nitride, strontium nitride, magnesium nitride, tantalum oxynitride, hafnium oxynitride, zirconium oxynitride, silicon oxynitride, germanium oxynitride, aluminum oxynitride, gallium oxynitride, yttrium oxynitride, lanthanum oxynitride, strontium oxynitride, and magnesium oxynitride can be used for the first insulator layer 40, the second insulator layer 41, and the third insulator layer 42. Note that even in a case where a nitride or an oxynitride described above is used for the first insulator layer 40, the second insulator layer 41, and the third insulator layer 42, the relationship between the average oxidation number of the cations contained in the hole injection layer 33, the average oxidation number of the cations contained in the insulator layer 37", and the average oxidation number of the cations contained in the hole transport layer 34 satisfies the relationship of Formula (D) described above. Also, the average oxidation number of the cations in the first insulator layer 40, the average oxidation number of the cations in the second insulator layer 41, and the average oxidation number of the cations in the third insulator layer 42 are each greater than the average oxidation number of the cations in the hole transport layer (HTL) 34 and each less than the average oxidation number of the cations in the hole injection layer (HIL) 33. Also, the average oxidation number of the cations in the third insulator layer 42 is less than the average oxidation number of the cations in the second insulator layer 41, and the average oxidation number of the cations in the second insulator layer 41 is less than the average oxidation number of the cations in the first insulator layer 40. In other words, the average oxidation number of the cations in the hole transport layer (HTL) 34 is less than the average oxidation number of the cations in the third insulator layer 42, the average oxidation number of the cations in the third insulator layer 42 is less than the average oxidation number of the cations in the second insulator layer 41, the average oxidation number of the cations in the second insulator layer 41 is less than the average oxidation number of the cations in the first insulator layer 40, and the average oxidation number of the cations in the first insulator layer 40 is less than the average oxidation number of the cations in the hole injection layer (HIL) 33.

The insulator layer 37" preferably includes a continuous film. That is, the at least one of the first insulator layer 40, the second insulator layer 41, or the third insulator layer 42 is preferably a continuous film. At least one of the first insulator layer 40, the second insulator layer 41, or the third insulator layer 42 is preferably formed by a sputtering method, a vapor deposition method, a chemical vapor deposition method (CVD) method, a physical vapor deposition (PVD) method, or the like, and the first insulator layer 40, the second insulator layer 41, and/or the third insulator layer 42 formed by such a method is a continuous film, and thus the contact area with in-contact layers is uniform, allowing for uniform hole injection to be achieved.

The insulator layer 37" may include an amorphous phase. In other words, at least one of the first insulator layer 40, the second insulator layer 41, or the third insulator layer 42 may include an amorphous phase. In this case, film thickness uniformity is improved and uniform hole injection is possible. Also, at least one of the first insulator layer 40, the second insulator layer 41, or the third insulator layer 42 may be constituted by an amorphous phase. In this case, film thickness uniformity is further improved and more uniform hole injection is possible.

Additionally, in the present embodiment, the first insulator layer 40, the second insulator layer 41, and the third insulator layer 42, i.e., the insulator layer 37", are all provided as island shapes. However, no such limitation is intended, and at least one of the first insulator layer 40, second insulator layer 41, or the third insulator layer 42 may be formed as a single common layer in the display device 2.

Fourth Embodiment

Next, a fourth embodiment of the disclosure will be described with reference to FIGS. 13 and 14. A light-emitting element 5R''' of the present embodiment differs from that of the first to third embodiments in that an insulator layer 37''' includes a first insulator layer 43, a second insulator layer 44, a third insulator layer 45, and a fourth insulator layer 46. Note that for convenience of explanation, components having the same functions as those described in diagrams of the first to third embodiments are appended with the same reference signs, and descriptions thereof may be omitted.

Figure 13:
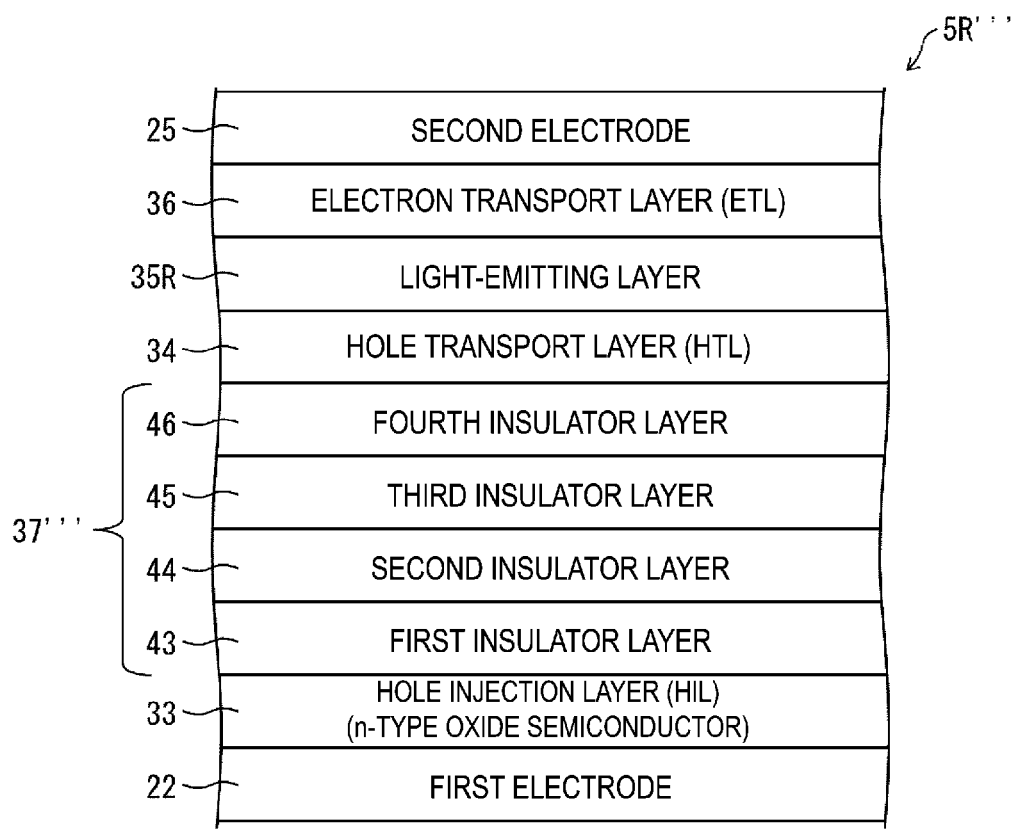
FIG. 13 is a diagram illustrating a schematic configuration of a light-emitting element according to a fourth embodiment.

FIG. 13 is a diagram illustrating a schematic configuration of the light-emitting element 5R''' according to the fourth embodiment.

As illustrated in FIG. 13, the light-emitting element 5R''' includes the first electrode 22, the second electrode (electron injection layer: EIL) 25, and the light-emitting layer 35R provided between the first electrode 22 and the second electrode 25. In other words, the first electrode 22 is an anode, and the second electrode 25 is a cathode. The hole injection layer (HIL) 33, the insulator layer 37''', and the hole transport layer (HTL) 34 are layered in this order between the first electrode 22 and the light-emitting layer 35R from the first electrode 22 side. Also, the electron transport layer (ETL) 36 is provided between the light-emitting layer 35R and the second electrode 25. The insulator layer 37''' includes the first insulator layer 43, the second insulator layer 44, the third insulator layer 45, and the fourth insulator layer 46. The first insulator layer 43 is provided between the hole injection layer (HIL) 33 and the second insulator layer 44 and is provided in contact with the hole injection layer (HIL) 33 and the second insulator layer 44. The second insulator layer 44 is provided between the first insulator layer 43 and the third insulator layer 45, and is provided in contact with the first insulator layer 43 and the third insulator layer 45. The third insulator layer 45 is provided between the second insulator layer 44 and the fourth insulator layer 46, and is provided in contact with the second insulator layer 44 and the fourth insulator layer 46. The fourth insulator layer 46 is provided between the third insulator layer 45 and the hole transport layer (HTL) 34, and is provided in contact with the third insulator layer 45 and the hole transport layer (HTL) 34.

The relationship between the average oxidation number of the cations contained in the hole injection layer 33, the average oxidation number of the cations contained in the insulator layer 37''', and the average oxidation number of the cations contained in the hole transport layer 34 satisfies the relationship of the following Formula (E).

(Average oxidation number of the cations contained in hole injection layer 33)>(average oxidation number of the cations contained in insulator layer 37''')>(average oxidation number of the cations contained in hole transport layer 34)  Formula (E)

Also, the first insulator layer 43, the second insulator layer 44, the third insulator layer 45, and the fourth insulator layer 46 contain different compounds containing one or more types of cations and one or more types of anions. The average oxidation number of the cations in the first insulator layer 43, the average oxidation number of the cations in the second insulator layer 44, the average oxidation number of the cations in the third insulator layer 45, and the average oxidation number of the cations in the fourth insulator layer 46 are each greater than the average oxidation number of the cations in the hole transport layer (HTL) 34 and each less than the average oxidation number of the cations in the hole injection layer (HIL) 33. The average oxidation number of the cations in the fourth insulator layer 46 is less than the average oxidation number of the cations in the third insulator layer 45, the average oxidation number of the cations in the third insulator layer 45 is less than the average oxidation number of the cations in the second insulator layer 44, the average oxidation number of the cations in the second insulator layer 44 is less than the average oxidation number of the cations in the first insulator layer 43. Specifically, the insulator layer 37''' includes the first insulator layer 43, the second insulator layer 44, the third insulator layer 45, and the fourth insulator layer 46, and thus the relationship of the following Formula (E') is satisfied.

(Average oxidation number of the cations contained in hole injection layer 33)>(average oxidation number of the cations contained in first insulator layer 43)>(average oxidation number of the cations contained in second insulator layer 44)>(average oxidation number of the cations contained in third insulator layer 45)>(average oxidation number of the cations contained in fourth insulator layer 46)>(average oxidation number of the cations contained in hole transport layer 34)  Formula (E')

FIG. 14 is a diagram listing example combinations of materials that can be used as the hole injection layer (HIL) 33, the first insulator layer 43, the second insulator layer 44, the third insulator layer 45, and the fourth insulator layer 46 forming the insulator layer 37''', and the hole transport layer (HTL) 34 provided in the light-emitting element 5R'''.

Combination example 19 listed in FIG. 14 satisfies the Formula (E) described above.

In the case of combination example 19, as the hole injection layer (HIL) 33, molybdenum oxide (for example, $MoO_3$) or tungsten oxide (for example, $WO_3$) with an average oxidation number of the cations of +6 is used, for example. Also, as the first insulator layer 43 in the insulator layer 37''', for example, tantalum oxide (for example, $Ta_2O_5$) with an average oxidation number of the cations of +5 is used. Also, as the second insulator layer 44 in the insulator layer 37''', hafnium oxide (for example, $HfO_2$), zirconium oxide (for example, $ZrO_2$), silicon oxide (for example, $SiO_2$), or germanium oxide (for example, $GeO_2$) with an average oxidation number of the cations of +4 is used, for example. Furthermore, as the third insulator layer 45 in the insulator layer 37''', aluminum oxide (for example, $Al_2O_3$), gallium oxide (for example, $Ga_2O_3$), yttrium oxide (for example, $Y_2O_3$), or lanthanum oxide (for example, $La_2O_3$) with an average oxidation number of the cations of +3 is used. Also, as the fourth insulator layer 46 of the insulator layer 37''', strontium oxide (for example, SrO) or magnesium oxide (for example, MgO) with an average oxidation number of the cations of +2 is used, for example. Also, as the hole transport layer (HTL) 34, an organic material (PEDOT: PSS, PVK, TFB, NPD, and the like) with essentially an average oxidation number of the cations of zero may be used, or a copper oxide (for example, $Cu_2O$) with an average oxidation number of the cations of +1 may be used, for example.

Note that in the case of combination example 19 described above, by inserting the insulator layer 37''', the formation of an interface state between the hole injection layer (HIL) 33 and the hole transport layer (HTL) 34 can be suppressed, and a vacuum level shift is suppressed from occurring. Thus, efficient hole injection is possible. Also, as the hole injection layer (HIL) 33, molybdenum oxide (for example, $MoO_3$) or tungsten oxide (for example, $WO_3$), which are oxides containing W or Mo, is used, for example. The absolute value of the electron affinity (energy difference between the vacuum level and the conduction band lower end) of the oxide containing W or Mo is equal to or greater than the absolute value of the ionization potential (energy difference between the vacuum level and the valence band upper end) of the hole transport layer (HTL) 34. Thus, the hole injection barrier, that is the energy difference between the conduction band lower end of the hole injection layer (HIL) 33 and the valence band upper end of the hole transport layer (HTL) 34, is zero or has a negative value and a hole injection barrier is not present between the hole injection layer (HIL) 33 and the hole transport layer (HTL) 34, thus enabling efficient hole injection.

Combination example 19 listed in FIG. 14 is an example, and in the example, Formula (E') described above is satisfied and the first insulator layer 43, the second insulator layer 44, the third insulator layer 45, and the fourth insulator layer 46 contain different compounds containing one or more types of cations and one or more types of anions. The average oxidation number of the cations in the first insulator layer 43, the average oxidation number of the cations in the second insulator layer 44, the average oxidation number of the cations in the third insulator layer 45, and the average oxidation number of the cations in the fourth insulator layer 46 are each greater than the average oxidation number of the cations in the hole transport layer (HTL) 34 and each less than the average oxidation number of the cations in the hole injection layer (HIL) 33. Also, the average oxidation number of the cations in the hole transport layer (HTL) 34 is less than the average oxidation number of the cations in the fourth insulator layer 46, the average oxidation number of the cations in the fourth insulator layer 46 is less than the average oxidation number of the cations in the third insulator layer 45, the average oxidation number of the cations in the third insulator layer 45 is less than the average oxidation number of the cations in the second insulator layer 44, the average oxidation number of the cations in the second insulator layer 44 is less than the average oxidation number of the cations in the first insulator layer 43, and the average oxidation number of the cations in the first insulator layer 43 is less than the average oxidation number of the cations in the hole injection layer (HIL) 33. The combination of materials of the hole injection layer (HIL) 33, the first insulator layer 43, the second insulator layer 44, the third insulator layer 45, the fourth insulator layer 46, and the hole transport layer (HTL) 34 is not limited to that of combination example 19 listed in FIG. 14, and as long as the average oxidation number of the cations in the hole transport layer (HTL) 34 is less than the average oxidation number of the cations in the fourth insulator layer 46, the average oxidation number of the cations in the fourth insulator layer 46 is less than the average oxidation number of the cations in the third insulator layer 45, the average oxidation number of the cations in the third insulator layer 45 is less than the average oxidation number of the cations in the second insulator layer 44, the average oxidation number of the cations in the second insulator layer 44 is less than the average oxidation number of the cations in the first insulator layer 43, and the average oxidation number of the cations in the first insulator layer 43 is less than the average oxidation number of the cations in the hole injection layer (HIL) 33, the materials can be selected as appropriate.

The insulator layer 37''' preferably contains an oxide, nitride, or oxynitride including one or more of Ta, Hf, Zr, Si, Ge, Al, Ga, Y, La, Sr, and Mg.

In a case where, as in combination example 19 described above, the hole injection layer (HIL) 33 contains an oxide containing at least one of W or Mo, so that the average oxidation number of the cations in the fourth insulator layer 46 is less than the average oxidation number of the cations in the third insulator layer 45, the average oxidation number of the cations in the third insulator layer 45 is less than the average oxidation number of the cations in the second insulator layer 44, the average oxidation number of the cations in the second insulator layer 44 is less than the average oxidation number of the cations in the first insulator layer 43, the first insulator layer 43 preferably contains an oxide, a nitride, or an oxynitride containing Ta. Also, the second insulator layer 44 preferably contains an oxide, a nitride, or an oxynitride containing one or more of Hf, Zr, Si, and Ge, and the third insulator layer 45 preferably contains an oxide, a nitride, or an oxynitride containing one or more of Al, Ga, Y, and La. Further, the fourth insulator layer 46 preferably contains an oxide, nitride, or oxynitride including one or more of Sr and Mg. Furthermore, the hole transport layer (HTL) 34 preferably contains an organic matter or an oxide containing Cu.

Note that from the perspective of making tunneling of holes, i.e., the carriers, easier to occur, the thickness of the insulator layer 37''', i.e., the combined thickness of the first insulator layer 43, the second insulator layer 44, the third insulator layer 45, and the fourth insulator layer 46, is preferably from 0.2 nm to 5 nm and more preferably from 0.5 nm to 3 nm.

Combination example 19 described above are examples in which the first insulator layer 43, the second insulator layer 44, the third insulator layer 45, and the fourth insulator layer 46 are oxides. However, no such limitation is intended, and a nitride or oxynitride using the same cations can be used as the first insulator layer 43, the second insulator layer 44, the third insulator layer 45, and the fourth insulator layer 46. For example, tantalum nitride, hafnium nitride, zirconium nitride, silicon nitride, germanium nitride, aluminum nitride, gallium nitride, yttrium nitride, lanthanum nitride, strontium nitride, magnesium nitride, tantalum oxynitride, hafnium oxynitride, zirconium oxynitride, silicon oxynitride, germanium oxynitride, aluminum oxynitride, gallium oxynitride, yttrium oxynitride, lanthanum oxynitride, strontium oxynitride, and magnesium oxynitride can be used for the first insulator layer 43, the second insulator layer 44, the third insulator layer 45, and the fourth insulator layer 46. Note that even in a case where a nitride or an oxynitride described above is used for the first insulator layer 43, the second insulator layer 44, the third insulator layer 45, and the fourth insulator layer 46, the relationship between the average oxidation number of the cations contained in the hole injection layer 33, the average oxidation number of the cations contained in the insulator layer 37''', and the average oxidation number of the cations contained in the hole transport layer 34 satisfies the relationship of Formula (E) described above. Also, the average oxidation number of the cations in the first insulator layer 43, the average oxidation number of the cations in the second insulator layer 44, the average oxidation number of the cations in the third insulator layer 45, and the average oxidation number of the cations in the fourth insulator layer 46 are each greater than the average oxidation number of the cations in the hole transport layer (HTL) 34 and each less than the average oxidation number of the cations in the hole injection layer (HIL) 33. Also, the average oxidation number of the cations in the fourth insulator layer 46 is less than the average oxidation number of the cations in the third insulator layer 45, the average oxidation number of the cations in the third insulator layer 45 is less than the average oxidation number of the cations in the second insulator layer 44, the average oxidation number of the cations in the second insulator layer 44 is less than the average oxidation number of the cations in the first insulator layer 43. In other words, the average oxidation number of the cations in the hole transport layer (HTL) 34 is less than the average oxidation number of the cations in the fourth insulator layer 46, the average oxidation number of the cations in the fourth insulator layer 46 is less than the average oxidation number of the cations in the third insulator layer 45, the average oxidation number of the cations in the third insulator layer 45 is less than the average oxidation number of the cations in the second insulator layer 44, the average oxidation number of the cations in the second insulator layer 44 is less than the average oxidation number of the cations in the first insulator layer 43, and the average oxidation number of the cations in the first insulator layer 43 is less than the average oxidation number of the cations in the hole injection layer (HIL) 33.

The insulator layer 37''' preferably includes a continuous film. That is the at least one of the first insulator layer 43, the second insulator layer 44, the third insulator layer 45, or the fourth insulator layer 46 is preferably a continuous film. At least one of the first insulator layer 43, the second insulator layer 44, the third insulator layer 45, or the fourth insulator layer 46 is preferably formed by a sputtering method, a vapor deposition method, a chemical vapor deposition method (CVD) method, a physical vapor deposition (PVD) method, or the like, and the first insulator layer 43, the second insulator layer 44, the third insulator layer 45, and/or the fourth insulator layer 46 formed by such a method is a continuous film, and thus the contact area with in-contact layers is uniform, allowing for uniform hole injection to be achieved.

The insulator layer 37''' may include an amorphous phase. In other words, at least one of the first insulator layer 43, the second insulator layer 44, the third insulator layer 45, or the fourth insulator layer 46 may include an amorphous phase. In this case, film thickness uniformity is improved and uniform hole injection is possible.

Additionally, in the present embodiment, the first insulator layer 43, the second insulator layer 44, the third insulator layer 45, and the fourth insulator layer 46, i.e., the insulator layer 37''', are all provided as island shapes. However, no such limitation is intended, and at least one of the first insulator layer 43, second insulator layer 44, the third insulator layer 45, or the fourth insulator layer 46 may be formed as a single common layer in the display device 2.

In the first to fourth embodiments described above, the insulator layer 37, 37', 37'', 37''' is constituted by from one to four layers. However, no such limitation is intended, and the insulator layer may be formed of five or more layers.

Supplement

First Aspect

A light-emitting element includes:
a first electrode that is an anode;
a second electrode that is a cathode;
a light-emitting layer provided between the first electrode and the second electrode;
a hole injection layer provided between the first electrode and the light-emitting layer; and
a hole transport layer provided between the hole injection layer and the light-emitting layer, wherein
an insulator layer is provided between the hole injection layer and the hole transport layer in contact with the hole injection layer and the hole transport layer;
the hole injection layer, the insulator layer, and the hole transport layer each include a compound including one or more types of a cation and one or more types of an anion;
the anion includes a group 15 or group 16 element of the periodic table; and
an average oxidation number of cations in the insulator layer is greater than an average oxidation number of cations in the hole transport layer and less than an average oxidation number of cations in the hole injection layer.

Second Aspect

In the light-emitting element according to the first aspect, the insulator layer includes one layer.

Third Aspect

In the light-emitting element according to the first aspect, the insulator layer includes a first insulator layer and a second insulator layer;
the first insulator layer is provided between the hole injection layer and the second insulator layer;
the second insulator layer is provided between the first insulator layer and the hole transport layer;
the first insulator layer and the second insulator layer each include a different compound including one or more types of cations and one or more types of anions;
an average oxidation number of cations in the first insulator layer and an average oxidation number of cations in the second insulator layer are each greater than an average oxidation number of cations in the hole transport layer and less than an average oxidation number of cations in the hole injection layer; and
an average oxidation number of cations in the second insulator layer is less than an average oxidation number of cations in the first insulator layer.

Fourth Aspect

In the light-emitting element according to the first aspect, the insulator layer includes a first insulator layer, a second insulator layer, and a third insulator layer;
the first insulator layer is provided between the hole injection layer and the second insulator layer;
the second insulator layer is provided between the first insulator layer and the third insulator layer;
the third insulator layer is provided between the second insulator layer and the hole transport layer;
the first insulator layer, the second insulator layer, and the third insulator layer each include a different compound including one or more types of cations and one or more types of anions;
an average oxidation number of cations in the first insulator layer, an average oxidation number of cations in the second insulator layer, and an average oxidation number of cations in the third insulator layer are each greater than an average oxidation number of cations in the hole transport layer and less than an average oxidation number of cations in the hole injection layer;

an average oxidation number of cations in the third insulator layer is less than an average oxidation number of cations in the second insulator layer; and an average oxidation number of cations in the second insulator layer is less than an average oxidation number of cations in the first insulator layer.

Fifth Embodiment

In the light-emitting element according to the first aspect, the insulator layer includes a first insulator layer, a second insulator layer, a third insulator layer, and a fourth insulator layer;
- the first insulator layer is provided between the hole injection layer and the second insulator layer;
- the second insulator layer is provided between the first insulator layer and the third insulator layer;
- the third insulator layer is provided between the second insulator layer and the fourth insulator layer;
- the fourth insulator layer is provided between the third insulator layer and the hole transport layer
- the first insulator layer, the second insulator layer, the third insulator layer, and the fourth insulator layer each include a different compound including one or more types of cations and one or more types of anions;
- an average oxidation number of cations in the first insulator layer, an average oxidation number of cations in the second insulator layer, an average oxidation number of cations in the third insulator layer, and an average oxidation number of cations in the fourth insulator layer are each greater than an average oxidation number of cations in the hole transport layer and less than an average oxidation number of cations in the hole injection layer;
- an average oxidation number of cations in the fourth insulator layer is less than an average oxidation number of cations in the third insulator layer;
- an average oxidation number of cations in the third insulator layer is less than an average oxidation number of cations in the second insulator layer; and
- an average oxidation number of cations in the second insulator layer is less than an average oxidation number of cations in the first insulator layer.

Sixth Aspect

In the light-emitting element according to any one of the first to fifth aspects, a film thickness of the insulator layer is from 0.2 nm to 5 nm.

Seventh Aspect

In the light-emitting element according to any one of the first to sixth aspects, the hole injection layer has electrical conductivity; and
the first electrode and the hole injection layer are formed as a single layer of the same material.

Eighth Aspect

In the light-emitting element according to any one of the first to seventh aspects, the hole injection layer includes an oxide including at least one of W or Mo.

Ninth Aspect

In the light-emitting element according to any one of the first to seventh aspects, the hole injection layer includes an oxide including Sn as a most common atom other than oxygen.

Tenth Aspect

In the light-emitting element according to any one of the first to seventh aspects, an energy difference $\Delta E=Eic-Etv$ between a conduction band lower end $Eic$ of the hole injection layer and a valence band upper end $Etv$ of the hole transport layer is from $-1$ eV to 0.26 eV.

Eleventh Aspect

In the light-emitting element according to the tenth aspect, the energy difference $\Delta E=Eic-Etv$ between the conduction band lower end $Eic$ of the hole injection layer and the valence band upper end $Etv$ of the hole transport layer is from $-1$ eV to 0 eV.

Twelfth Aspect

In the light-emitting element according to any one of the first to eighth and eleventh aspects, the insulator layer includes an oxide, a nitride, or an oxynitride including one or more of Ta, Hf, Zr, Si, Ge, Al, Ga, Y, La, Sr, and Mg.

Thirteenth Aspect

In the light-emitting element according to the second aspect, the hole injection layer includes an oxide including at least one of W or Mo;
- the insulator layer includes an oxide, a nitride, or an oxynitride including one or more of Ta, Hf, Zr, Si, Ge, Al, Ga, Y, La, Sr, and Mg; and
- the hole transport layer includes an organic matter or an oxide including one or more of Cu, Ni, and Al.

Fourteenth Aspect

In the light-emitting element according to the second aspect, the hole injection layer includes an oxide including Sn as a most common atom other than oxygen;
- the insulator layer includes an oxide, a nitride, or an oxynitride including one or more of Al, Ga, Y, La, Sr, and Mg; and
- the hole transport layer includes an organic matter or an oxide including one or more of Cu and Ni.

Fifteenth Aspect

In the light-emitting element according to the second aspect, the hole injection layer includes an oxide including In;
- the insulator layer includes an oxide, a nitride, or an oxynitride including one or more of Sr and Mg; and
- the hole transport layer includes an organic matter or an oxide including Cu.

Sixteenth Aspect

In the light-emitting element according to the third aspect, the hole injection layer includes an oxide including at least one of W or Mo;
- the first insulator layer includes an oxide, a nitride, or an oxynitride including one or more of Ta, Hf, Zr, Si, Ge, Al, Ga, Y, and La;
- the second insulator layer includes an oxide, a nitride, or an oxynitride including one or more of Hf, Zr, Si, Ge, Al, Ga, Y, La, Sr, and Mg; and
- the hole transport layer includes an organic matter or an oxide including one or more of Cu, Ni, and Al.

Seventeenth Aspect

In the light-emitting element according to the third aspect, the hole injection layer includes an oxide including Sn as a most common atom other than oxygen;
- the first insulator layer includes an oxide, a nitride, or an oxynitride including one or more of Al, Ga, Y, and La;
- the second insulator layer includes an oxide, a nitride, or an oxynitride including one or more of Sr and Mg; and
- the hole transport layer includes an organic matter or an oxide including Cu.

Eighteenth Aspect

In the light-emitting element according to the fourth aspect, the hole injection layer includes an oxide including at least one of W or Mo;

the first insulator layer includes an oxide, a nitride, or an oxynitride including one or more of Ta, Hf, Zr, Si, and Ge;

the second insulator layer includes an oxide, a nitride, or an oxynitride including one or more of Hf, Zr, Si, Ge, Al, Ga, Y, and La;

the third insulator layer includes an oxide, a nitride, or an oxynitride including one or more of Al, Ga, Y, La, Sr, and Mg; and the hole transport layer includes an organic matter or an oxide including one or more of Cu and Ni.

Nineteenth Aspect

In the light-emitting element according to the fifth aspect, the hole injection layer includes an oxide including at least one of W or Mo;

the first insulator layer includes an oxide, a nitride, or an oxynitride including Ta;

the second insulator layer includes an oxide, a nitride, or an oxynitride including one or more of Hf, Zr, Si, and Ge;

the third insulator layer includes an oxide, a nitride, or an oxynitride including one or more of Al, Ga, Y, and La;

the fourth insulator layer includes an oxide, a nitride, or an oxynitride including one or more of Sr and Mg; and the hole transport layer includes an organic matter or an oxide including Cu.

Twentieth Aspect

In the light-emitting element according to any one of the first to nineteenth aspects, the insulator layer and the hole transport layer include an oxide.

Twenty-First Aspect

In the light-emitting element according to any one of the first to twentieth aspects, the insulator layer includes a continuous film.

Twenty-Second Aspect

In the light-emitting element according to any one of the first to twenty-first aspects, the insulator layer includes an amorphous phase.

Twenty-Third Aspect

In the light-emitting element according to any one of the first to twenty-second aspects, the insulator layer is formed in island shapes.

Twenty-Fourth Aspect

A light-emitting device including the light-emitting element according to any one of the first to twenty-third aspects; and a control circuit that controls light emission of the light-emitting element.

Twenty-Fifth Aspect

A display device including the light-emitting element according to any one of the first to twenty-third aspects; and a control circuit that controls light emission of the light-emitting element.

APPENDIX

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

INDUSTRIAL APPLICABILITY

The disclosure may be utilized in a light-emitting element, a light-emitting device, and a display device.

The invention claimed is:

1. A light-emitting element, comprising:
a first electrode that is an anode;
a second electrode that is a cathode;
a light-emitting layer provided between the first electrode and the second electrode;
a hole injection layer provided between the first electrode and the light-emitting layer; and
a hole transport layer provided between the hole injection layer and the light-emitting layer,
wherein an insulator layer is provided between the hole injection layer and the hole transport layer, the insulator layer being in contact with the hole injection layer and the hole transport layer,
each of the hole injection layer, the insulator layer, and the hole transport layer comprises a compound independently including one or more types of a cation and one or more types of an anion,
the anion includes a group 15 or a group 16 element of the periodic table,
an average oxidation number of cations in the insulator layer is greater than an average oxidation number of cations in the hole transport layer and less than an average oxidation number of cations in the hole injection layer,
an entirety of a surface of the insulator layer disposed between the hole injection layer and the hole transport layer is in direct contact with an entirety of a surface of the hole injection layer, and
an entirety of another surface of the insulator layer disposed between the hole injection layer and the hole transport layer is in direct contact with an entirety of a surface of the hole transport layer.

2. The light-emitting element according to claim 1,
wherein the insulator layer includes one layer.

3. The light-emitting element according to claim 1,
wherein the insulator layer includes a first insulator layer and a second insulator layer,
the first insulator layer is provided between the hole injection layer and the second insulator layer,
the second insulator layer is provided between the first insulator layer and the hole transport layer,
the first insulator layer and the second insulator layer each include a different compound independently including one or more types of cations and one or more types of anions,
an average oxidation number of cations in the first insulator layer and an average oxidation number of cations in the second insulator layer are each greater than an average oxidation number of cations in the hole transport layer and less than an average oxidation number of cations in the hole injection layer, and
an average oxidation number of cations in the second insulator layer is less than an average oxidation number of cations in the first insulator layer.

4. The light-emitting element according to claim 1,
wherein the insulator layer includes a first insulator layer, a second insulator layer, and a third insulator layer,
the first insulator layer is provided between the hole injection layer and the second insulator layer,
the second insulator layer is provided between the first insulator layer and the third insulator layer,
the third insulator layer is provided between the second insulator layer and the hole transport layer,
the first insulator layer, the second insulator layer, and the third insulator layer each include a different compound independently including one or more types of cations and one or more types of anions, an average oxidation number of cations in the first insulator layer, an average oxidation number of cations in the second insulator layer, and an average oxidation number of cations in the third insulator layer are each greater than an average oxidation number of cations in the hole transport layer and less than an average oxidation number of cations in the hole injection layer, an average oxidation number of cations in the third insulator layer is less than an average oxidation number of cations in the second insulator layer, and an average oxidation number of cations in the second insulator layer is less than an average oxidation number of cations in the first insulator layer.

5. The light-emitting element according to claim 1, wherein the insulator layer includes a first insulator layer, a second insulator layer, a third insulator layer, and a fourth insulator layer, the first insulator layer is provided between the hole injection layer and the second insulator layer, the second insulator layer is provided between the first insulator layer and the third insulator layer, the third insulator layer is provided between the second insulator layer and the fourth insulator layer, the fourth insulator layer is provided between the third insulator layer and the hole transport layer the first insulator layer, the second insulator layer, the third insulator layer, and the fourth insulator layer each include a different compound independently including one or more types of cations and one or more types of anions, an average oxidation number of cations in the first insulator layer, an average oxidation number of cations in the second insulator layer, an average oxidation number of cations in the third insulator layer, and an average oxidation number of cations in the fourth insulator layer are each greater than an average oxidation number of cations in the hole transport layer and less than an average oxidation number of cations in the hole injection layer, an average oxidation number of cations in the fourth insulator layer is less than an average oxidation number of cations in the third insulator layer, an average oxidation number of cations in the third insulator layer is less than an average oxidation number of cations in the second insulator layer, and an average oxidation number of cations in the second insulator layer is less than an average oxidation number of cations in the first insulator layer.

6. The light-emitting element according to claim 1, wherein a film thickness of the insulator layer is from 0.2 nm to 5 nm.

7. The light-emitting element according to claim 1, wherein the hole injection layer has electrical conductivity, and the first electrode and the hole injection layer are formed as a single layer of a same material.

8. The light-emitting element according to claim 1, wherein the hole injection layer further comprises an oxide including at least one of W or Mo.

9. The light-emitting element according to claim 1, wherein the hole injection layer further comprises an oxide including Sn as a most common atom other than oxygen.

10. The light-emitting element according to claim 1, wherein an energy difference, $\Delta E = E_{ic} - E_{tv}$, between a conduction band lower end ($E_{ic}$) of the hole injection layer and a valence band upper end ($E_{tv}$) of the hole transport layer is from $-1$ eV to $0.26$ eV.

11. The light-emitting element according to claim 10, wherein the energy difference, $\Delta E = E_{ic} - E_{tv}$, between the conduction band lower end ($E_{ic}$) of the hole injection layer and the valence band upper end ($E_{tv}$) of the hole transport layer is from $-1$ eV to $0$ eV.

12. The light-emitting element according to claim 1, wherein the insulator layer further comprises an oxide, a nitride, or an oxynitride including one or more of Ta, Hf, Zr, Si, Ge, Al, Ga, Y, La, Sr, and Mg.

13. The light-emitting element according to claim 1, wherein the hole injection layer further comprises an oxide including at least one of W or Mo, the insulator layer further comprises an oxide, a nitride, or an oxynitride including one or more of Ta, Hf, Zr, Si, Ge, Al, Ga, Y, La, Sr, and Mg, and the hole transport layer further comprises an organic matter or an oxide including one or more of Cu, Ni, and Al.

14. The light-emitting element according to claim 1, wherein the hole injection layer further comprises an oxide including Sn as a most common atom other than oxygen, the insulator layer further comprises an oxide, a nitride, or an oxynitride including one or more of Al, Ga, Y, La, Sr, and Mg, and the hole transport layer further comprises an organic matter or an oxide including one or more of Cu and Ni.

15. The light-emitting element according to claim 1, wherein the hole injection layer further comprises an oxide including In, the insulator layer further comprises an oxide, a nitride, or an oxynitride including one or more of Sr and Mg, and the hole transport layer further comprises an organic matter or an oxide including Cu.

16. The light-emitting element according to claim 3, wherein the hole injection layer includes an oxide including at least one of W or Mo, the first insulator layer includes an oxide, a nitride, or an oxynitride including one or more of Ta, Hf, Zr, Si, Ge, Al, Ga, Y, and La, the second insulator layer includes an oxide, a nitride, or an oxynitride including one or more of Hf, Zr, Si, Ge, Al, Ga, Y, La, Sr, and Mg, and the hole transport layer includes an organic matter or an oxide including one or more of Cu, Ni, and Al.

17. The light-emitting element according to claim 3, wherein the hole injection layer includes an oxide including Sn as a most common atom other than oxygen, the first insulator layer includes an oxide, a nitride, or an oxynitride including one or more of Al, Ga, Y, and La, the second insulator layer includes an oxide, a nitride, or an oxynitride including one or more of Sr and Mg, and the hole transport layer includes an organic matter or an oxide including Cu.

18. The light-emitting element according to claim 4, wherein the hole injection layer includes an oxide including at least one of W or Mo, the first insulator layer includes an oxide, a nitride, or an oxynitride including one or more of Ta, Hf, Zr, Si, and Ge, the second insulator layer includes an oxide, a nitride, or an oxynitride including one or more of Hf, Zr, Si, Ge, Al, Ga, Y, and La, the third insulator layer includes an oxide, a nitride, or an oxynitride including one or more of Al, Ga, Y, La, Sr, and Mg, and the hole transport layer includes an organic matter or an oxide including one or more of Cu and Ni.

19. The light-emitting element according to claim 5, wherein the hole injection layer includes an oxide including at least one of W or Mo, the first insulator layer includes an oxide, a nitride, or an oxynitride including Ta, the second insulator layer includes an oxide, a nitride, or an oxynitride including one or more of Hf, Zr, Si, and Ge, the third insulator layer includes an oxide, a nitride, or an oxynitride including one or more of Al, Ga, Y, and La, the fourth insulator layer includes an oxide, a nitride, or an oxynitride including one or more of Sr and Mg, and the hole transport layer includes an organic matter or an oxide including Cu.

20. A light-emitting device, comprising:

the light-emitting element according to claim 1; and a control circuit that controls light emission of the light-emitting element.

\* \* \* \* \*